(12) United States Patent
Klyuev et al.

(10) Patent No.: US 8,508,134 B2
(45) Date of Patent: Aug. 13, 2013

(54) HALL-CURRENT ION SOURCE WITH IMPROVED ION BEAM ENERGY DISTRIBUTION

(76) Inventors: Evgeny Vitalievich Klyuev, Klimovsk (RU); Viacheslav Vasilievich Zhurin, Fort Collins, CO (US)

( * ) Notice: Subject to any disclaimer, the term of this patent is extended or adjusted under 35 U.S.C. 154(b) by 488 days.

(21) Appl. No.: 12/804,763

(22) Filed: Jul. 29, 2010

(65) Prior Publication Data
US 2012/0025710 A1    Feb. 2, 2012

(51) Int. Cl.
*H01J 7/24* (2006.01)

(52) U.S. Cl.
USPC ................................ 315/111.81; 315/111.91

(58) Field of Classification Search
USPC ............. 315/111.31, 111.41, 111.81, 111.91; 313/359.1, 360.1, 361.1, 362.1, 153, 156, 313/157, 158, 161; 250/423 R, 425 F, 427
See application file for complete search history.

(56) References Cited

U.S. PATENT DOCUMENTS

| | | | |
|---|---|---|---|
| 4,862,032 A | | 8/1989 | Kaufman et al. |
| 5,845,880 A | * | 12/1998 | Petrosov et al. ............. 244/169 |
| 5,847,493 A | * | 12/1998 | Yashnov et al. ......... 313/231.31 |
| 6,504,294 B1 | * | 1/2003 | Mahoney et al. .......... 313/359.1 |
| 6,608,431 B1 | | 8/2003 | Kaufman |
| 6,645,301 B2 | | 11/2003 | Sainty |
| 6,750,600 B2 | * | 6/2004 | Kaufman et al. ........... 313/361.1 |
| 6,819,053 B2 | * | 11/2004 | Johnson .................... 315/111.51 |
| 6,849,854 B2 | | 2/2005 | Sainty |
| 7,116,054 B2 | * | 10/2006 | Zhurin ...................... 315/111.41 |
| 7,276,140 B2 | * | 10/2007 | Yoo et al. ................. 204/298.34 |
| 7,312,579 B2 | * | 12/2007 | Zhurin ...................... 315/111.41 |
| 7,342,236 B2 | | 3/2008 | Burtner et al. |
| 7,589,474 B2 | * | 9/2009 | Chu et al. ................. 315/111.81 |

* cited by examiner

*Primary Examiner* — Minh D A

(57) ABSTRACT

A Hall-current ion source with a narrow ion beam energy distribution is presented. A narrow ion beam energy distribution is provided by a utilization of a multi-chamber anode through which a working gas is applied and delivers a uniform working gas distribution in a discharge channel. Introduction of a working gas through a lower part of anode makes applied electric potential in a narrow area and leading to enhanced conditions for a working gas ionization, high ion beam current, high translation of a discharge voltage into a "monochromatic" ion beam mean energy distribution. A multi-chamber anode with a slit exit for introduction of a working gas into area under anode is utilized to prevent a backflow of insulating and dielectric depositions on anode parts, and under anode area makes a nominal operation with reactive gases without a phenomenon called as "anode poisoning" during long operating hours. The ion source with a shielded Hot Filament design shows very effective ion beam neutralization properties; it produces less heating of the substrate than a traditional one; it has a cleaner ion beam because its beam is not contaminated by the Hot Filament material particles. In the design with two Hot Filaments the ion source operation is extended for tens of hours.

4 Claims, 17 Drawing Sheets

HALL-CURRENT ION SOURCE WITH IMPROVED ION BEAM ENERGY DISTRIBUTION

FIELD OF INVENTION

This invention relates in general to the technology of ion and plasma sources, electric propulsion thrusters and other applications utilizing development of low energy ion beams, in particular to the industrial broad beam ion sources of a Hall-current ion type that are widely utilized in the thin film technology.

BACKGROUND ART

About 40 years ago main industrial ion sources were of so-called gridded types which are described in detail by H. Kaufman and R. Robinson in "*Operation of Broad-Beam Sources*", Commonwealth Scientific Corporation, Alexandria, Va., 1987. These gridded ion sources are utilized for development of ion beams of low and medium energy (100-1500 eV) in varieties of thin film technologies for cleaning, etching, sputtering, deposition. However, despite of continued utilization of gridded ion sources at present time, they are not used broadly as it was earlier. That is because of their complexity, high cost and problems with an ion beam neutralization that prevent obtaining high ion beam currents at low energies of about and especially under 100 eV. The other type of ion sources are the Hall-current ion sources that are utilized for about last 30 years for development of ion beams of low and medium energy (20-500 eV) in varieties of thin film technologies for cleaning, sputtering, deposition, ion assist, etc. Hall-current ion sources sometime also are called as gridless ion sources in comparison with gridded ion sources. Hall-current ion sources are substantially simpler than gridded ones and they have no problem with ion beam neutralization caused by a space charge limitation that takes place in the gridded ion sources. Practically all ion sources at the beginning have been developed from the electric propulsion technologies utilized very successfully for propulsion of space satellites and other space apparatuses.

One of the most frequently utilized Hall-current ion sources in thin film technology is a so-called end-Hall ion source. This gridless ion source has discharge chamber occupied by a massive hollow anode in a form of a cut cone. Magnetic field in such ion source is provided by a magnetic system that consists usually of a permanent magnet and an ion source's external shell made of a magnetically soft iron. Permanent magnet fabricated in a form of a cylinder of certain length of 40-100 mm with a diameter of 10-20 mm and has at its end pieces-poles a magnetic field value from about 400-500 G and to about 1000-1500 G. In some cases, instead of a permanent magnet a solenoid made of a heat-resistant wire provides necessary magnetic field in a discharge channel. Solenoid has advantage that its magnetic field can be regulated by a direct current. However, a solenoid needs additional power supply for that current.

Here is how an end-Hall-current ion source operates. Working gas such as Argon, Xenon, Oxygen, Nitrogen, Hydrogen, Methane and others is introduced in to a discharge channel through a series of holes in lower part of a discharge channel, under a hollow conical anode, or from a side wall under anode, or other parts of a discharge chamber. At the same time, a positive potential is applied to anode and there is realized a certain potential drop between anode and cathode. A cathode placed usually outside of an ion source's exit flange produces electrons which travel in to a discharge channel and start discharge at a discharge ignition voltage, when the condition for beginning discharge takes place, as it is determined by the Paschen conditions (Paschen curves), which is a product of pressure p and distance d between electrodes (anode and cathode) at low pressures ($V_{ign}$=f (p·d)). After achieving of an electric breakdown (also called ignition) state determined by the Paschen curve for a particular working gas, an electrical discharge begins. This discharge produces ions that move into a cathode side together with neutralizing electrons supplied by cathode. These ions accompanied with electrons in a form of ion beam possessing certain energy are utilized for bombardment of targets, or substrates. Bombarded targets or substrates can be either sputtered, or influenced by an ion beam depending on ion beam energy and current. Sputtered particles move out of target to a substrate and make thin film depositions of a designed structure. If an ion beam is utilized for influence of deposited thin film for improvement of the thin film properties it is called as an ion assisted deposition. Despite that in a scientific literature all estimations are made for an ion beam, all ion beams, as a rule, are always accompanied with electrons that are supplied by cathode. Ion beams without electrons is rare phenomenon; in such a case, they become unstable and expand due to mutual repulsion of ions.

In Hall-current ion sources electrons, as it was above mentioned, are needed for ionization of a working gas and for ion beam neutralization. Such electrons are usually supplied by a cathode of one or another type. Also for correct organization of electric discharge processes in an ion source discharge channel it is desirable to avoid straight propagation of electrons from cathode to anode and to prevent arcing during discharge. Arcing in ion sources is prevented by a magnetic field that is applied in to a discharge channel; in such a case electrons become "magnetized"; theirs direction of propagation changes by a crossed magnetic field component; an electron velocity component that is parallel to a magnetic field makes no impact on electron's rotation. It is also preferable that in a discharge channel should be existed a substantial transversal component of a magnetic field. Such magnetic field usually, as above mentioned, is provided either by a permanent magnet or magnets or electromagnetic coil, or coils. Whole design of an ion source includes a magnetic circuit with a permanent magnet, or electromagnetic coils and an ion source's chamber parts usually made of a magnetically soft steel, except anode and a gas distributing system. Though there are anodes made of magnetic material in a so-called Anode Layer Closed Drift thruster-ion source. In a magnetic circuit, there are observed two poles placed in a discharge chamber. They are usually a permanent magnet's top (first pole) and an ion source's exit flange (second pole).

Two types of Hall-current ion sources are on a market for industrial applications. One of the first ion sources of such type was a Closed Drift ion source, as described by V. V. Zhurin et al in article "*Physics of Closed Drift Thrusters*" in *Plasma Sources Science & Technology*, Vol. 8 (1999), beginning on page R1. The most well-known variation of another type of a Hall-current is an end-Hall ion source as it was described in U.S. Pat. No. 4,862,032 by H. Kaufman and R. Robinson "End-Hall Ion Source". Also, end-Hall ion sources of various designs were developed by: W. G. Sainty, "Ion Source", U.S. Pat. No. 6,849,854, Feb. 1, 2005; V. V. Zhurin, "Hall-Current Ion Source for Ion Beams of Low and High Energy for Technological Applications", U.S. Pat. No. 7,312,579, Dec. 25, 2007; D. M. Burtner, S. A. Townsend, D. E. Siegfried, V. V. Zhurin, "Fluid-Cooled Ion Source", U.S. Pat. No. 7,342,236, Mar. 11, 2008. End-Hall ion sources have been described in many patents and articles mainly by major producers of ion sources in USA and Russia. In the last 10-15 years new producers of industrial ion sources were appeared in China and South Korea as it was described by V. V. Zhurin in "*Industrial Gridless Broad Beam Ion Sources and the Need for Their Standardization. Part 2. End-Hall Ion Sources for Thin Film Technology*", in Vacuum Technology & Coating, May 2009, p 40-51.

The main and most important operating parameters of ion sources are: 1. discharge current $I_d$ and its operation range; 2. discharge voltage $V_d$ and its operation range; 3. stability of discharge current and voltage in broad range of these values. Actually, a discharge current $I_d$ is responsible for development of an ion beam current I; that is a number of ionized particles per unit time and area. A discharge voltage $V_d$ is responsible for an ion beam energy $E_i$, which is kinetic energy of ionized particles moving with high velocity in discharge channel. In a performance for the main operational characteristics such as an ion beam current an ion beam mean energy $E_i$ and purity of an ion beam (presence of varieties of contaminants from sputtered parts of ion source, or from inadequate pumping of a vacuum chamber and ion source) of a Closed Drift type ion source substantially exceeds an end-Hall type. However, end-Hall ion sources, in general, have a simpler design than a Closed Drift type. Also, unfortunately for regular users, Closed Drift ion sources need to be optimized by a magnetic field and such optimization does not have simple dependence of a magnetic field value as described by V. V. Zhurin et al in article "*Physics of Closed Drift Thrusters*" in *Plasma Sources Science & Technology*, Vol. 8 (1999), beginning on page R1. Closed Drift ion sources as Electric Propulsion thrusters were utilized successfully on many space satellites.

End-Hall ion sources usually have a range of discharge voltages from about 50-60 V with noble gases, and up to 80-100 V with Oxygen and Nitrogen, and up to about 300 V and can be used for obtaining low energy ion beams with ion beam mean energies of 30-40 eV and up to about 180-200 eV. Closed Drift ion sources can not deliver low energy ion beams like end-Halls. Closed Drift ion sources usually start operation at discharge voltages of about 80-100 V with noble gases and at 100-120 V with Oxygen and Nitrogen and their maximum discharge voltages can be easy extended up to about 1000 V. This is explained by a presence of a substantial value of a transversal magnetic field component in Closed Drift ion sources in comparison with end-Hall ion sources that have a quite low value of a magnetic field transversal component. End-Hall ion sources have mainly a longitudinal component of magnetic field. That is why end-Hall ion sources have easy ignition discharge conditions at comparatively low discharge voltages of 50-60 V and Closed Drift ion sources due to a presence of a substantial transversal component of magnetic field experience problems in ignition at low discharge voltages. Also Closed Drift ion Sources in general have a so-called positive magnetic field gradient in a discharge channel as it was described by V. V. Zhurin et al in article "*Physics of Closed Drift Thrusters*" in *Plasma Sources Science & Technology*, Vol. 8 (1999), beginning on page R1. A positive magnetic field gradient in a discharge channel, when magnetic field increases from anode to a discharge channel exit, allows suppressing many different types of oscillations and operating with discharge voltages up to 1000 V. An end-Hall type ion source has a negative magnetic field gradient, when magnetic field decreases from anode to a discharge channel exit, and, because of this, has problems operating at discharge voltages over 300 V.

The main features of end-Hall ion sources suffer from the following shortcomings. An ion beam current, which is a derivative of a discharge current, is usually a small portion of a discharge current; in other words, it means that a working gas is not sufficiently ionized and substantial portion of working gas leaves a discharge channel not ionized. In one of the varieties of Hall-current ion sources that is called as a Closed Drift Ion Source, which is described in article "*Physics of Closed Drift Thrusters*" *in Plasma Sources Science and Technology* by V. V. Zhurin et al, and in U.S. Pat. No. 7,312,579 by V. V. Zhurin, it is shown that the Closed Drift ion sources have a high ratio of an ion beam current $I_i$ to a discharge current $I_d$, or $I_i/I_d \approx 0.8$-$0.9$. However, in the end-Hall ion sources that utilized in thin film technology more frequently than Closed Drift ion sources, the ratio of an ion beam current $I_i$ to a discharge current $I_d$, is quite low, or $I_i/I_d \approx 0.2$-$0.25$. It means that the end-Hall ion sources, in order to produce the same effect by an ion beam on a target or a substrate have to apply more electric power in to an end-Hall ion source discharge channel than a Closed Drift ion source.

Another variety of ion sources utilized in thin film technology, and that was above mentioned, is called the gridded ion sources that considered in general as electrostatic particles acceleration, in which after discharge in a discharge chamber the ionized ions are extracted through a system of screen and accelerating grids with aligned small apertures in the grids. An ion beam is developed from numerous individual beamlets when they leave the accelerator's grid. Gridded ion sources operate successfully at relatively high discharge voltages from about 200 V and to about 1500 V. Ion beam currents are not high, especially at lower discharge voltages, they are about 100-200 mA. However, the gridded ion sources have comparatively monoenergetic ion beam energy distribution and high translation of applied potential into an ion beam energy.

An ion beam of end-Hall ion source in comparison with gridded ion sources has no monochromatic energy, instead it has quite a broad energy distribution, and in practice it is usually determined through a mean ion beam energy $E_i$ which is a total ion energy distribution divided by an ion beam current. In all Hall-current ion sources that utilize a source of electrons for ion beam neutralization a mean ion beam energy $E_i$ ratio to an applied electric potential $V_d$ multiplied by an electric charge is also a part of this applied potential, or $E_i/eV_d \approx 0.6$-$0.7$. For other types of ion sources, like linear Anode Layer ion sources, which are a part of Closed Drift family ion sources, that operate at comparatively high discharge voltages of about 500-4000 V and without an external source of electrons for ion beam neutralization the ratio of a mean ion beam energy $E_i$ to an applied electric potential $V_d$ multiplied by an electron charge can be as $E_i/eV_d \approx 0.5$ at maximum, but, in general, this ratio is 0.1-0.2.

An end-Hall ion source can provide comparatively high ion beam currents over 1-2 A at low ion beam mean energies of around 100-150 eV with quite broad ion beam energy distribution, for example, $E_i \approx 125 \pm 50$-$75$ eV at discharge voltage $V_d = 210$ V. Gridded ion sources can not provide high ion beam currents at low energies. They can deliver about 100-200 mA at low energies, but gridded ion sources can deliver quite a monochromatic ion beam energy, for example, $E_i \approx 575 \pm 25$ eV at accelerating voltage of $V_a = 600$ V. For many thin film deposition tasks it is necessary to have high ion beam currents and ion beam energy in a narrow range of values. In such a case, it is simpler to design required conditions for interaction of ion beam of certain energy with target and/or substrate. This means that it will be desirable to develop a Hall current ion source with a high ion beam current with comparatively monochromatic ion beam energy similar to a gridded ion source. Also, when end-Hall sources are utilized in an ion assisted deposition technique as additional source of ions for enhanced impact-processing of a sputtered thin film, in certain cases, end-Hall ion beams are inadequate for a continuous stress modulation through the entire deposited thin film layer, simply because of a presence of very wide range of ions with various energies. For example, if an ion assisted energy is about 100 eV, but it distribution has a spread of over 50-100 eV, these energetic ions instead of compacting a deposition can destroy, remove some parts of deposition having energy higher than a sputtering threshold of deposited material, and low energy ions would not produce a desirable effect of a thin film deposition compacting, or will be lost in the process. In other words, such a broad beam energy distribution could be harmful, or inefficient for certain thin film deposition processes.

In many cases, especially at high discharge currents, an ion beam coming out of an end-Hall ion source's discharge channel is quite contaminated by materials of a discharge channel: an anode, a gas-distributor, called frequently as a reflector, an external pole-exit flange, and by a Hot Filament, or a Hollow Cathode materials utilized for an ion beam neutralization. Due to these problems, it also will be desirable to design an end-Hall ion source that produces substantially less contamination of an ion beam leaving an ion source discharge channel in to a target and a substrate's side.

Another very important feature of Hall current ion sources is necessity of stable, reliable operation of such ion sources with reactive gases. During operation with reactive gases there are developed oxidized, nitridized particles that deposit on a discharge channel's walls and, in particular, on anode surface and gradually change its electrical conductivity. This process called sometime as anode "poisoning" leads to a situation when a discharge voltage at a constant discharge current provided by a Power Supply due to loss of anode's surface electrical conductivity starts gradually increasing. With a constant discharge voltage provided by a Power Supply a discharge current decreases gradually. In both cases the operating conditions drastically change and usually cause unplanned interruption of a process. This anode "poisoning" state is very serious and lead to development of several patent applications, in which various methods how to reduce the anode "poisoning" were introduced. One of them a U.S. Pat. No. 6,750,600 "Hall-Current Ion Source" by H. R. Kaufman, J. R. Kahn, R. S. Robinson, V. V. Zhurin suggests utilization of a grooved anode in the end-Hall type ion source with some parts of anode surfaces that do not "see" returned back dielectric and insulating particles, because in pressure conditions that end-Hall ion source operates particles propagate along straight lines. Also in this patent there is suggested a placement of a shield in front of a discharge channel to reduce a returned back flow of dielectric and insulating particles from a target and a vacuum chamber into an anode surface.

In a U.S. Pat. No. 7,312,579 "Hall-Current Ion Source for Ion Beams of Low and High Energy for Technological Applications" by V. V. Zhurin a working gas is introduced through holes in anode as an alternative way for gas application. In this patent an increased area of a gas distributing system under anode and in this area is suggested with numerous holes for a gas application directed at a certain angle to a source's axis for better gas distribution under anode. Also in this patent it is suggested to utilize an electron emission current exceeding a discharge current in the discharge operation mode of a so-called non-self-sustained regime. All these measures helped to improve an ionization process reducing an ion beam energy at low discharge voltages and correspondingly to an ion beam energy distribution.

Another big problem that exists with appearance of industrial ion sources is their adequate neutralization of a positively charged ion beam. For this purpose there are utilized various sources of electrons such as a Hot Filament, a Hollow Cathode, a Plasma Bridge and many other ways producing electrons. These electron sources were recently described in detail by V. V. Zhurin in "Cathodes-Neutralizers for Ion Sources, Part 1, Introduction, Hot Filaments", Vacuum Technology & Coating, January 2010, p 45-53, "Cathodes-Neutralizers for Ion Sources, Part 2, Hollow Cathodes", Vacuum Technology & Coating, February 2010 p 32-44, "Cathodes-Neutralizers for Ion Sources, Part 3, Plasma Bridge, RF and Other Neutralization Methods", Vacuum Technology & Coating, May 2010, p 38-47. The most simple and inexpensive cathode neutralizer is a Hot Filament that heated to high temperatures over 2000-2500 K providing a thermoelectron emission. Hot Filament is cheap and can be easily changed after each vacuum chamber opening, if necessary. Its filament, usually made of Tungsten wire, is placed on a way of an ion beam and during its operation it is bombarded by ion beam, becomes sputtered by ion beam and breaks under its impact. At the same time, an ion beam becomes contaminated by Tungsten particles. For pure thin film processes such contamination is undesirable. Hot Filaments usually last not long, from several hours to just over 10 hours at moderate applied powers of Id=1-5 A and Vd=100-150 V. The higher the discharge current and voltage, the shorter a Hot Filament lifetime. The best ion beam source neutralizer is a Hollow Cathode, but it is quite complex in operation and maintenance, and expensive. That is why most ion sources users prefer Hot Filaments. Unfortunately, a Hot Filament consumes a quite high electric power and radiates into practically all directions and into a side of a target, and a substrate heating them that in many cases is very undesirable, especially, for the temperature sensitive materials. All these problems were discussed in detail in above mentioned articles by V. V. Zhurin published in Vacuum Technology & Coating. To find a more optimum way of utilization of a Hot Filament without ion beam contamination and with longer lifetime would improve many thin film deposition operation techniques significantly.

SUMMARY OF THE INVENTION

In a light of foregoing, it is an object of the invention to introduce an ion source of an end-Hall-current type with a series of improved features including an ion energy distribution with a narrow spread of energies from a mean energy. This spread is equal to a mean ion beam energy plus minus of about 20-25 eV, which is significantly less than for existing end-Hall ion sources that in general have an ion beam energy distribution plus minus about 50-100 eV.

Another object of the present invention is introduction of an end-Hall-current ion source that has a working gas applied through anode for reducing a spread of applied potential on working gas atoms-molecules in a narrow region of anode itself, in comparison with regular end-Hall-current ion sources, in which a working gas is usually applied under anode in a gas distributing area that leads to a wide distribution of applied potential to ionized working gas and, correspondingly, to a wide ion beam energy distribution of developed ions.

Still another object of the present invention is introduction of a Hall-current ion source and, in particular, an end-Hall type ion source with a substantially reduced ion beam contamination from discharge channel parts such as anode, and especially from a gas distributing system, from which a working gas flow is provided in to a discharge channel. This place is called a reflector; it separates also a discharge channel and area where a permanent magnet is placed. Reflector usually becomes severely sputtered by ion beam that is developed in the area between reflector and anode. A working gas application through anode provides ionization of working gas in anode area and applied electric field accelerates developed ions mainly in to a discharge channel exit in comparison with most utilized end-Hall ion sources, in which a working gas is applied under anode area, and where developed ions have a significant component of ion beam accelerating in to a reflector area.

Another object of the present invention is utilization of a multi-chamber anode design, and, in this particular case, for simplicity, there is utilized a two-chamber anode for obtaining a more uniform working gas distribution in to an external anode area providing improved conditions for working gas ionization, its acceleration and, correspondingly, obtaining higher ratio of ion beam current to applied discharge current; in other words, improving an ion source efficiency of working gas transformation into an ion beam.

Yet another object of the present invention is introduction of a Hall-current ion source that has a working gas applied through a two-chamber anode's instead of a series of holes for a working gas introduction in anode, a utilization of a specifically designed cavity that evenly distributes a working gas through anode and provides a substantial area in this anode cavity with electrically conductive surface that is "invisible" for returning particles back from a target, substrate and vacuum chamber parts containing oxides that can "poison" anode, i.e. to cover its surface with dielectric or insulating layers that drastically change regular assigned operating conditions. Such working gas introduction reduces an anode "poisoning" substantially and provides evenly distribution of a working gas that helps to continue a long time operation in the condition when some anode parts are covered with deposited dielectric and electric non-conducting insulating thin films.

Still another object of the present invention is to utilize a two-chamber anode design with a working gas introduction through anode holes and anode slit for obtaining an improved ion beam energy transformation from applied electric potential $V_d$ of about $E_i \approx 0.9 \cdot eV_d$, where e is electron charge and $V_d$ is applied to anode potential. In regular end-Hall ion sources discussed above, in U.S. Pat. No. 4,862,032, "End-Hall Ion Source" by H. Kaufman and R. Robinson, "Ion Source", U.S. Pat. No. 6,849,854, "Ion Source" by W. Sainty; U.S. Pat. No. 7,312,579 "Hall-Current Ion Source for Ion Beams of Low and High Energy for Technological Applications", by V. Zhurin; U.S. Pat. No. 7,342,236, "Fluid-Cooled Ion Source", by D. M. Burtner, S. A. Townsend, D. E. Siegfried, V. V. Zhurin; all these ion sources have the ratio $E_i/eV_d \approx 0.6$-$0.7$.

Still another object of the present invention is to utilize a two-chamber anode design with a working gases introduction of mixtures of reactive and noble gases through anode holes and anode slit for obtaining a stable operation of an ion source at reduced discharge voltages—energies with reactive gases such as Oxygen and Nitrogen. In regular end-Hall ion sources discussed above, in U.S. Pat. No. 4,862,032, "End-Hall Ion Source" by H. Kaufman and R. Robinson, "Ion Source", U.S. Pat. No. 6,849,854, "Ion Source" by W. Sainty; U.S. Pat. No. 7,312,579 "Hall-Current Ion Source for Ion Beams of Low and High Energy for Technological Applications", by V. Zhurin; U.S. Pat. No. 7,342,236, "Fluid-Cooled Ion Source", by D. M. Burtner, S. A. Townsend, D. E. Siegfried, V. V. Zhurin, the range of operating characteristics with reactive gases is usually from about 80-100 V to about 300 V that would translate into ion beam mean energies of about 50-180 eV.

However, for certain thin film technology tasks it is necessary to have energies of reactive gases under 50 eV. End-Hall ion sources of a Prior Art, above mentioned, could not operate at discharge voltages under 80-100 V due to developing strong oscillations, as it described in V. V. Zhurin, "Oscillations and Instabilities in Hall-Current Ion Sources", Vacuum Technology & Coating, December 2008, p 55-60.

Still another object of the present invention is to utilize a placement of a Hot Filament on a top of an ion source exit flange outside an ion beam flow, and Hot Filament's heated wire is covered with a specially designed shield that protects a target and a substrate from a Hot Filament radiation and eliminates an ion beam contamination with a Hot Filament wire material, and still effectively neutralizes and ion beam.

BRIEF DESCRIPTION OF THE DRAWINGS

Features of the present invention, which believed to be patentable, are set forth with particularity in the appended claims. The organization and operation manner of the invention together with further objectives and advantages thereof, may be understood by reference to the following descriptions of specific embodiments taken in connection with accompanying drawings, in the several figures, in which:

DESCRIPTION OF PRIOR ART

Figure 1:
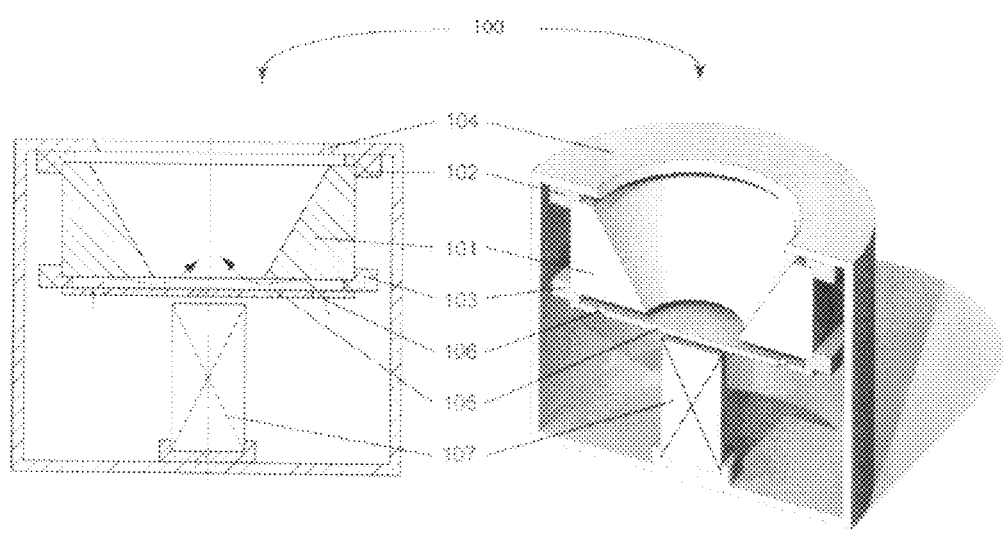
FIG. 1 is a schematic and three-dimensional drawing of a prior art apparatus of a Hall-current ion source called an end-Hall ion source that is described in U.S. Pat. No. 4,862, 032, "End-Hall Ion Source" by H. Kaufman, R. Robinson.

FIG. 1 presents a schematic drawing of end-Hall ion source described in U.S. Pat. No. 4,862,032 "End-Hall Ion Source" by Kaufman, R. Robinson. As it was written above, the U.S. Pat. No. 4,862,032 by Kaufman, R. Robinson is one of the first end-Hall ion sources that was utilized as an industrial ion source for various tasks of thin film technology in a broad industrial scale. In this U.S. Pat. No. 4,862,032 by H. Kaufman, R. Robinson a source of electrons for ionization of a working gas and for an ion beam neutralization a Hot Filament, or a Hollow Cathode were utilized and they were placed outside of an ion source's external flange. Over a decade earlier there was presented a first end-Hall type ion source by B. N. Titishov, S. V. Lebedev in "*Stationary Plasma Source of Low-Energy Ions*", II All-Union Conference on Plasma Accelerators, Minsk, 2-5 Oct., 1973, p 101-102, an end-Hall ion source with a cathode in a form of a Hot Filament placed inside a discharge channel under a cylindrical hollow anode. Such a design was tested and worked well at not high discharge currents, and it was not very practical, because to substitute a Hot Filament, which usually has to be done after about 10-20 hours or less of operation, it was necessary to disassemble the whole ion source.

Some new designs in last several years of end-Hall ion sources were suggested by H. Kaufman in U.S. Pat. No. 6,608,431 "Modular Gridless Ion Source" and by D. Burtner, S. A. Townsend, D. E. Siegfried, V. V. Zhurin in U.S. Pat. No. 7,342,236 "Fluid-Cooled Ion Source" that introduced varieties of features that improved the main operation characteristics such as: a range of discharge voltages, which is usually from about 60 V (noble gases)-80 V (reactive gases such as Oxygen and Nitrogen) and up to maximum 300 V, a range of discharge currents, which depends on ion source geometrical dimensions and magnetic system, which is usually from about 0.5 A and up to 5 A for noble and reactive gases. Also, there are recent designs of major ion sources producers, such as Veeco Instruments Inc. and Kaufman & Robinson Inc. both have end-Hall ion source that can operate with the discharge currents up to 15 A, but at low discharge voltages of about 150-200 V and under.

FIG. 1 shows a schematic and three-dimensional drawing of a typical end-Hall ion source from a prior art of U.S. Pat. No. 4,862,032 "End-Hall Ion Source" by H. Kaufman, R. Robinson, where an ion source 100 is surrounded by a vacuum enclosure (not shown) with a vacuum chamber that is preliminary pumped out to about $10^{-7}$-$10^{-6}$ Torr and operating typically with applied working gas at pressures from about $5 \cdot 10^{-5}$ Torr to about $(1-2) \cdot 10^{-3}$ Torr. Magnetic field lines are mostly axial in a discharge channel, except an exit area, where they become radial. This ion source has a magnetic system consisting of several parts such as: a permanent magnet 107 (though, it can be substituted for a magnetic coil that needs additional Power Supply) that is considered as an internal magnetic pole, a magnetically permeable shell 108 with an external magnetic pole—outer flange 104. A hollow conical anode 101 is placed between two insulators 102 and 103. These insulators in end-Hall ion sources of numerous producers are made with different approach, forms, numbers and various materials. An ion source produces a plasma flow consisting of ions and accompanying them electrons. Neutralized plasma flows through an exit-front flange from an ion source discharge channel which is mainly a hollow anode internal part. The end-Hall ion source usually has an electron source for ion beam neutralization and ionization of a working gas (not shown in this FIG. 1). An electron source can be either a Hot Filament, or a Hollow Cathode, or a Plasma Bridge, or other source of electrons, as it was described in a series of articles "*Cathodes-Neutralizers for Ion Sources*" by V. Zhurin in Vacuum Technology & Coating of January, February and May, 2010 issues.

Gas-distributor (reflector) 105 usually made of electrically conducting material is utilized for a working gas application through holes 106 that is located under a hollow cut cone shape anode and separated from a ground and anode by dielectric insulators 103 is under a floating potential that becomes positively charged at about half of anode potential, or $0.5V_d$. Due to existence of magnetic field high longitudinal component $B_z$ along an ion source's axis and because a working gas is introduced under anode area working gas molecules are in a quite an extended region of acceleration and electric potential is applied to molecules with various electric potentials. That is why an ion beam has a broad ion beam energy distribution. Also because a working gas is applied under anode area the ions and electrons obtain velocity component in reversed direction from exit, in to the reflector's side. This portion of ion beam applied to the reflector produces substantial erosion sputtering reflector's material and contaminating an ion beam.

Figure 2A:
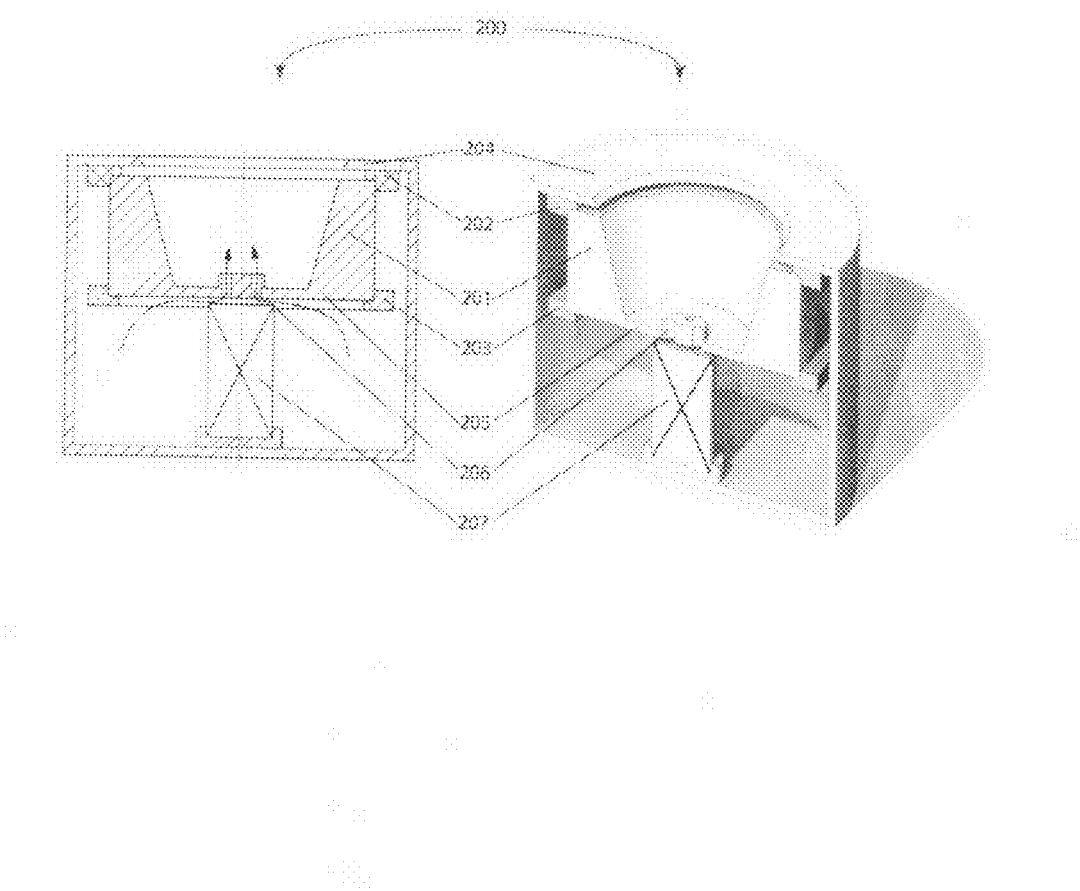
FIG. 2a is a schematic and three-dimensional drawing of a prior art apparatus of a Hall-current ion source called an end-Hall ion source that is described in U.S. Pat. No. 6,645, 301 by W. Sainty.

In FIG. 2a there is shown a schematic and three-dimensional drawing of an end-Hall ion source 200 from a prior art of U.S. Pat. No. 6,645,301 "Ion Source" by W. Sainty with a discharge channel that is under anode potential including a gas distributing area-reflector. This ion source is very much similar to that shown in FIG. 1, in which: 201 is anode; 202 is an insulator separating an upper flange and anode; 203 is insulator on which anode is placed; 204 is an upper flange that also serves as an external magnetic pole; 205 is a reflector connected to anode and on which there is placed a so-called a shower cup 206 serving for introduction of a working gas into a discharge channel; 207 is a permanent magnet, also serving as a magnetic pole.

This design in practice is easy to assemble-disassemble but it has certain shortcomings. Reflector 205 connected to anode 201 operates as anode itself. Electron current delivered by external source of electrons—neutralizer, becomes attracted to the central part of a reflector, because mainly longitudinal magnetic field provides confinement of a discharge area and directs straight to the center of a reflector-anode leading to substantial sputtering of a reflector. Also such a design reduces an ion beam current in comparison with a reflector 105 that is under a floating potential shown in FIG. 1. For example, for a working gas Argon a discharge voltage $V_d=50$ V and discharge current $I_d=5$ A an ion beam current for end-Hall with a floating potential $I_i=0.8$ A; for end-Hall with a reflector connected with anode $I_i=0.4$ A. For $V_d=100$ V, $I_d=5$ A an ion beam current for a floating potential design $I_i\approx1.2$ A and for a reflector connected with anode $I_i\approx0.6$ A.

Figure 2B:
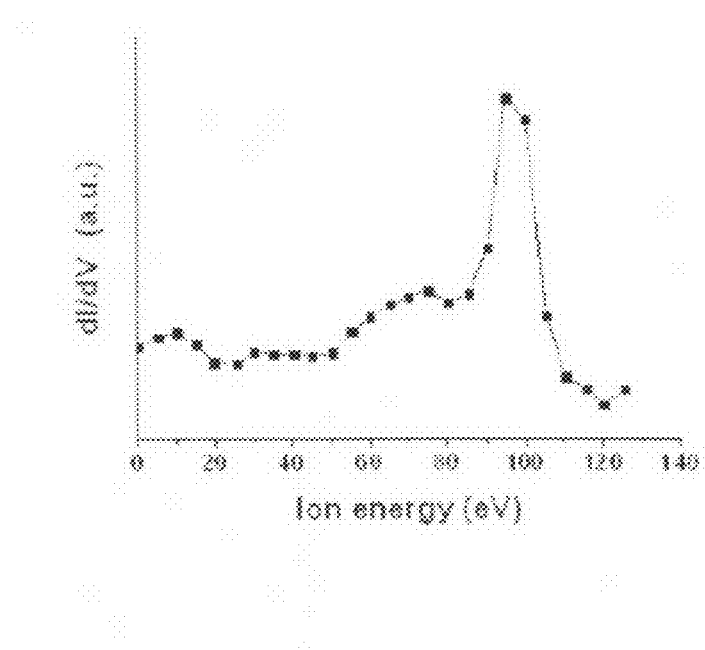
FIG. 2b is a graphical representation depicting an ion beam energy distribution made with end-Hall ion source described in U.S. Pat. No. 6,645,301 by W. Sainty.

In FIG. 2b there is shown an ion energy distribution of end-Hall ion source described in "*Characterization of a High Output Gridless Ion Source*" by D. Gardner, W. Sainty and published in SVC 48th Annual Technical Conference Proceedings, 2005, of end-Hall ion source of U.S. Pat. No. 6,645, 301 "Ion Source" by W. Sainty and shown in FIG. 2a. The operational conditions are: a working gas is Oxygen with a mass flow $\square_a=20$ sccm, a discharge voltage $V_d=125$ V. As one can see, a peak of a mean ion energy is at about $E_i\approx95$ eV with a very broad low-energy wing down to a zero eV and over 130 eV. As one can see, it is not easy to characterize a mean ion energy of this ion source, especially in a low energy distribution.

Figure 3A:
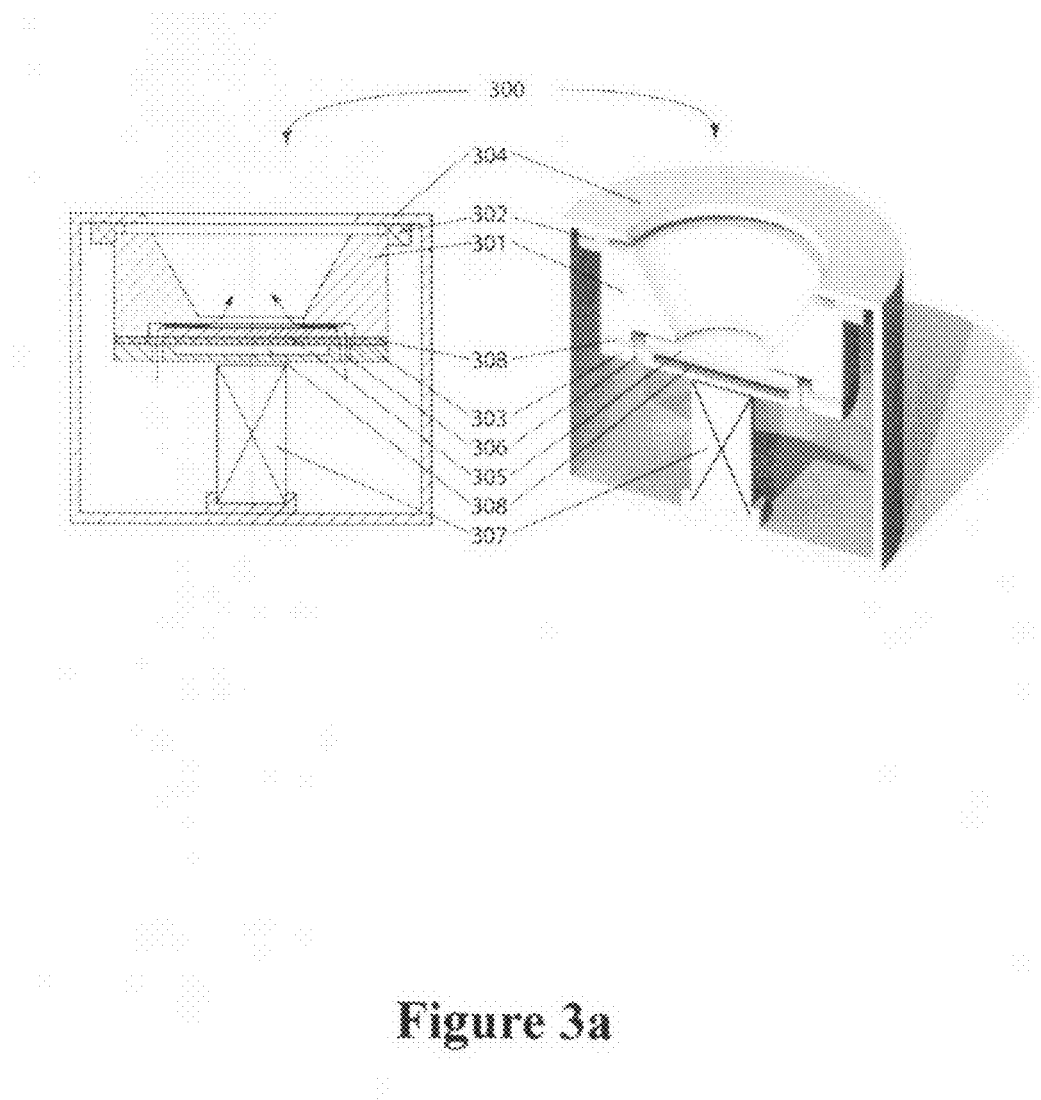
FIG. 3a is a schematic and three-dimensional drawing of a prior art apparatus of end-Hall ion source described in U.S. Pat. No. 7,342,236 by D. Burtner, S. A. Townsend, D. E. Siegfried, V. V. Zhurin.

In FIG. 3a there is shown a schematic and three-dimensional drawing of recently developed end-Hall ion source 300 of U.S. Pat. No. 7,342,236 "Fluid-Cooled Ion Source" by D. Burtner, S. A. Townsend, D. E. Siegfried, V. V. Zhurin, where there is presented an unusual approach for anode 301 cooling through a dielectric plate 308, and a cooling metal plate 303 filled with water, or any other cooling liquid. Also on this FIG. 3a one can see an insulator 302 between anode and upper flange—pole 304, a reflector 305, a working gas flow through holes 306, a magnet 307, and a fluid cooling cavity 308 in a metal plate 303. The advantage of such a design is that, in comparison with a regular end-Hall ion source that is cooled with water or coolant applied in to an anode cavity and such a design has a problem of water or a coolant being under an anode high voltage potential, in this design anode is separated from water by a dielectric plate between a water-cooled plate. And anode is cooled through this dielectric plate. This design with intermediate dielectric plate has another advantage, which is a fast assembly-disassembly of the anode block. However, this design has a substantial disadvantage: anode in the conditions of ion source operation vacuum, when a mean free path of working gas molecules is substantially longer than a discharge channel width, can not be properly cooled through an intermediate dielectric or insulator, because with a long mean free path of working gas molecules there is no convective heat transfer leading to cooling, there is only a radiation cooling, and anode becomes overheated especially at high applied powers. Also, because a working gas is applied under anode area an ion beam energy distribution is wide and a flow of ions and electrons has a component directed in opposite direction of an exit flange—external pole; and this portion of ion beam applied to the reflector produces substantial erosion sputtering reflector's material and contaminating an ion beam.

Figure 3B:
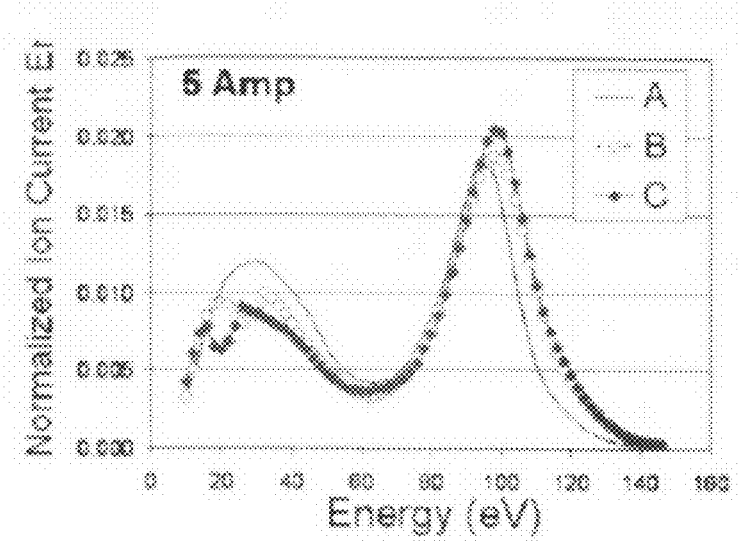
FIG. 3b is a graphical representation depicting an ion beam energy distribution made with end-Hall ion source produced by Veeco Instruments and described in U.S. Pat. No. 7,342, 236 by D. Burtner, S. A. Townsend, D. E. Siegfried, V. V. Zhurin and in U.S. Pat. No. 4,862,032 by H. Kaufman, R. Robinson.

In FIG. 3b there is shown a graphical representation of an ion beam energy distribution made from a prior art end-Hall ion source of U.S. Pat. No. 7,342,236 "Fluid-Cooled Ion Source" by D. Burtner, S. A. Townsend, D. E. Siegfried, V. V. Zhurin and described by L. Mahoney et al, in "*A New End-Hall Ion Source with Improved Performance*", 49$^{th}$ Annual Technical Conference Proceedings of the Society of Vacuum Coaters, 2005. This graphical presentation of ion beam energy distribution gives such dependence for three versions of end-Halls: A is energy distribution of Mark-II end-Hall described in U.S. Pat. No. 4,862,032 "End-Hall Ion Source" by H. Kaufman, R. Robinson operating with Hot Filament as a cathode—a source of electrons and shown in FIG. 1; B is energy distribution of Mark-II$^+$ end-Hall described in U.S. Pat. No. 7,342,236 "Fluid-Cooled Ion Source" by D. Burtner, S. A. Townsend, D. E. Siegfried, V. V. Zhurin operating with Hot Filament as a cathode—a source of electrons; C is energy distribution of Mark-Ir end-Hall described in U.S. Pat. No. 7,342,236 "Fluid-Cooled Ion Source" by D. Burtner, S. A. Townsend, D. E. Siegfried, V. V. Zhurin operating with a Hollow Cathode as a source of electrons. The operating conditions are: a working gas is Argon, a discharge current is $I_d=5$ A and a discharge voltage is $V_d=100$ V. As one can see an energy distribution shows quite broad spread from about 10 eV and up to about 140 eV, or $E_i\approx100+40/-90$ eV, with broad energy spread around an ion beam mean energy and, in particular, a very broad low-energy wing down to about 10 eV. It is necessary to note that in FIG. 2b, FIG. 3b the values shown on y-axis are similar; they have different names, but all of them mean "An Ion Beam Distribution Function", as it is presented and discussed below in FIG. 4b and FIG. 6b; they are only differently normalized.

Figure 4A:
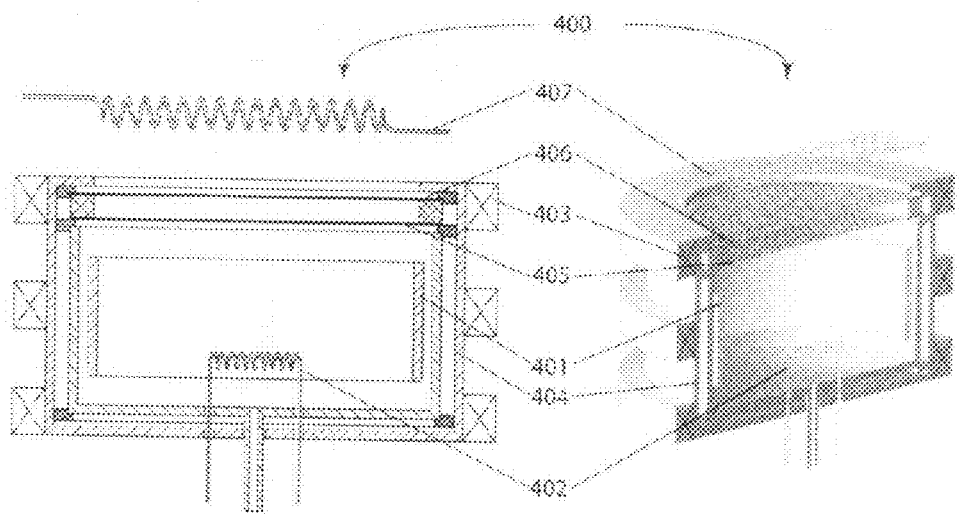
FIG. 4a is a schematic and three-dimensional drawing of a gridded ion source and described in "Operation of Broad Beam Ion Sources" by H. Kaufman, R. Robinson, Commonwealth Scientific Corporation, Alexandria, Va., 1987.

In FIG. 4a there is shown a schematic and three-dimensional drawing of a gridded ion source 400 described in general in "*Operation of Broad Beam Ion Sources*" by H. Kaufman, R. Robinson, Commonwealth Scientific Corporation, Alexandria, Va., 1987 and numerous publications about gridded ion sources and thrusters. Here there are shown: anode 401 in a discharge chamber 404; a cathode 402; magnets 403; a screen positive grid 405; an accelerating negative grid 406; a cathode-neutralizer 407. Gridded ion sources usually operate at comparatively high accelerating potentials from about 200 V and up to 1500 V. Only at high discharge voltages such ion sources can deliver high ion beam currents of about 1 A and higher. At lower discharge voltages of 100-200 V regularly they provide 50-100 mA of ion beam current, which is much less than end-Hall ion sources that can deliver ion beam currents up to 3-5 A.

Figure 4B:
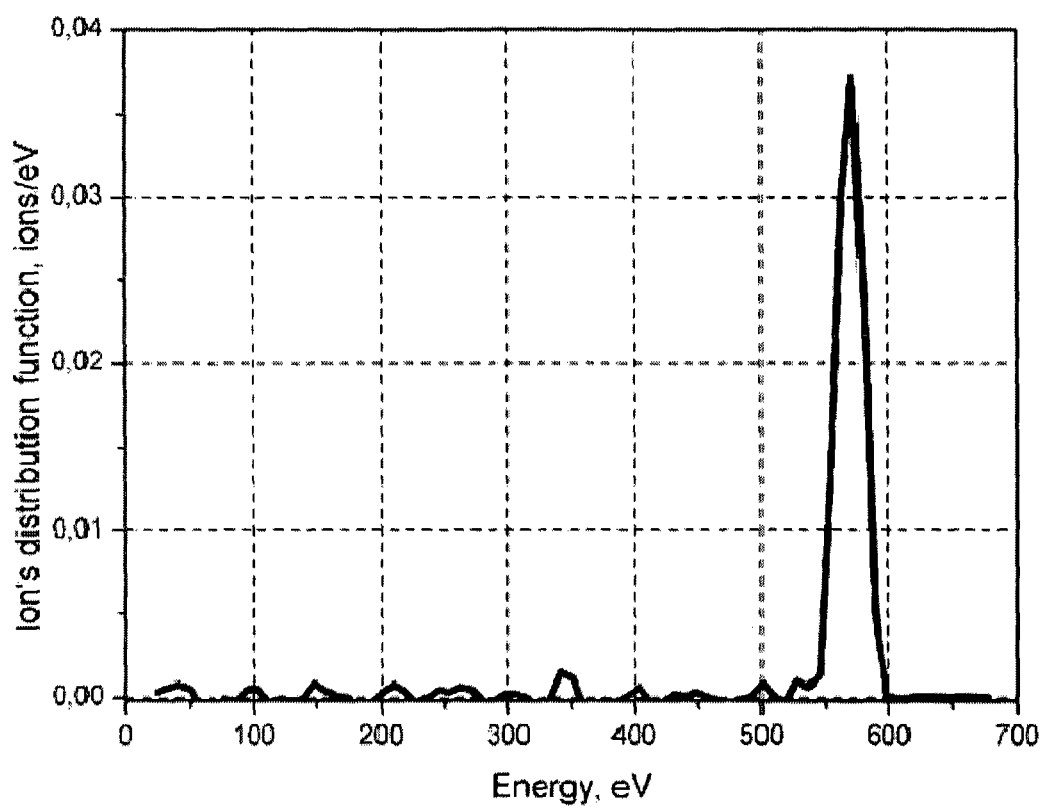
FIG. 4b is a graphical representation depicting an ion beam energy distribution of a gridded ion source produced by Platar Company and experimentally measured by P. Tsygankov in "New Baum Ville Ion Probe Set", Bauman Technical University, Moscow, Russia, 2009.

In FIG. 4b there is shown a graphical representation of an ion beam energy distribution for a gridded ion source made by Platar Ltd and tested by P. Tsygankov in "*New Baum Ville Ion Probe Set*", Bauman Technical University, Moscow, Russia, 2003. The operation conditions for this gridded ion source were: a working gas is Argon, an accelerating potential is $V_d=600$ V, a discharge current is $I_d=100$ mA. As one can see, the mean ion energy is about 570 eV, or an ion beam energy transformation from a discharge voltage is $E_i/eV_d=570/600$ 0.95 with $E_i\approx570\pm30$ eV, where $\pm30$ eV is energy spread around an ion beam mean energy. To this time an ion beam of gridded ion sources was always considered as practically monochromatic one, because there were no detailed measurements of ion beam energy distribution of gridded ion sources. As one can see, the mean ion beam energy differs from the applied accelerating potential, but very close and, in practice, all experiments on sputtering with gridded ion sources were of the accelerator's potential, like an example of a FIG. 4b would be assumed if a $V_d$=600 V, then an ion beam energy is taken equal $E_i$=600 eV. However, as one can see in FIG. 4b, an ion beam mean energy in reality is $E_i \approx 570 \pm 30$ eV and, but still can be considered as a comparatively monochromatic energy distribution.

From what was presented in FIGS. 2b and 3b the end-Hall energy distributions are substantially wider than of a gridded ion source shown in FIG. 4a, and these energy distributions in the end-Hall ion sources are extended broadly into a low energy distributions and even higher than the discharge voltage $V_d$.

Figure 5:
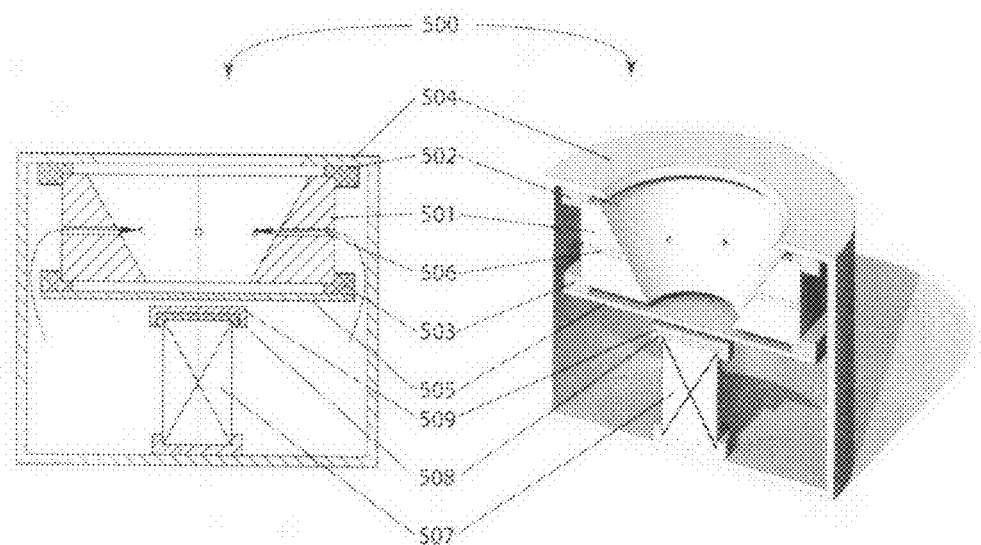
FIG. 5 is a schematic and three-dimensional drawing of a prior art apparatus of end-Hall ion source with a working gas applied through anode as described by V. V. Zhurin in U.S. Pat. No. 7,312,579 "Hall-Current Ion Source for Ion Beams of Low and High Energy for Technological Applications".

In FIG. 5 there is shown a schematic and three-dimensional drawing of recently developed end-Hall ion source 500 by V. V. Zhurin, "Hall-Current Ion Source for Ion Beams of Low and High Energy for Technological Applications", U.S. Pat. No. 7,312,579. This end-Hall ion source, where 501 is anode; 502 is insulator between anode 501 and an upper flange—pole 504; another insulator 503 separates anode 501 and a reflector 505; a working gas is introduced into discharge channel through holes 506 in anode 501; a magnet 509 is an ion source axis, as usual; on a top of a magnet 507 there is placed an insulator 508, on which there is placed a nonmagnetic electrically conducting cup 509 protecting magnet from direct sputtering by an ion beam that can, in some cases, penetrate through a reflector 505; also a protective cup 509 is connected with external circuit and gives a signal when an ion beam penetrates through a reflector 505. The distinctive feature of this end-Hall is introduction of a working gas through anode's holes 506.

DESCRIPTION OF THE PREFERRED EMBODIMENTS

Figure 6A:
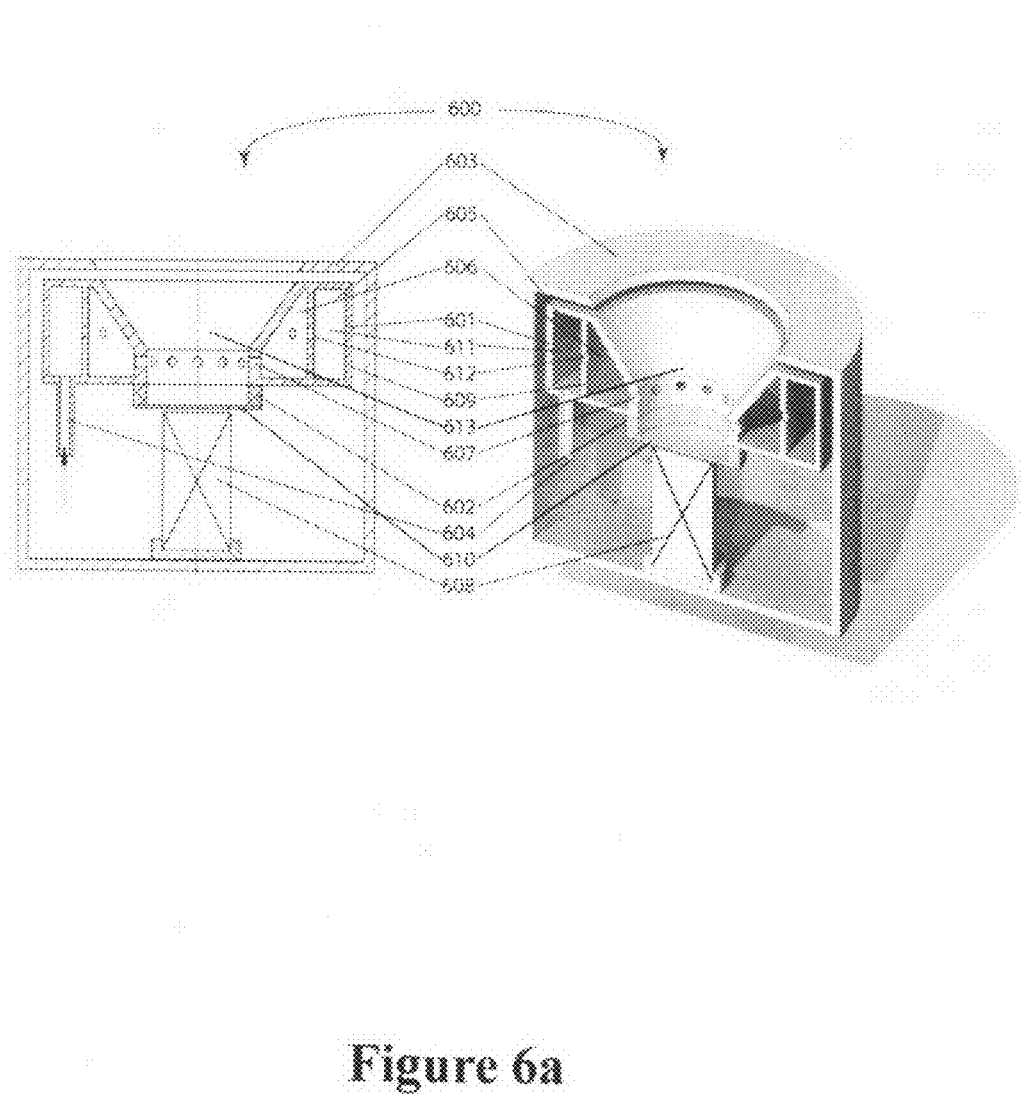
FIG. 6a is a schematic and three-dimensional drawing of an invented two-chamber anode for enhanced distribution of working gas and with holes in anode for working gas introduction in to a discharge chamber.
Figure 6B:
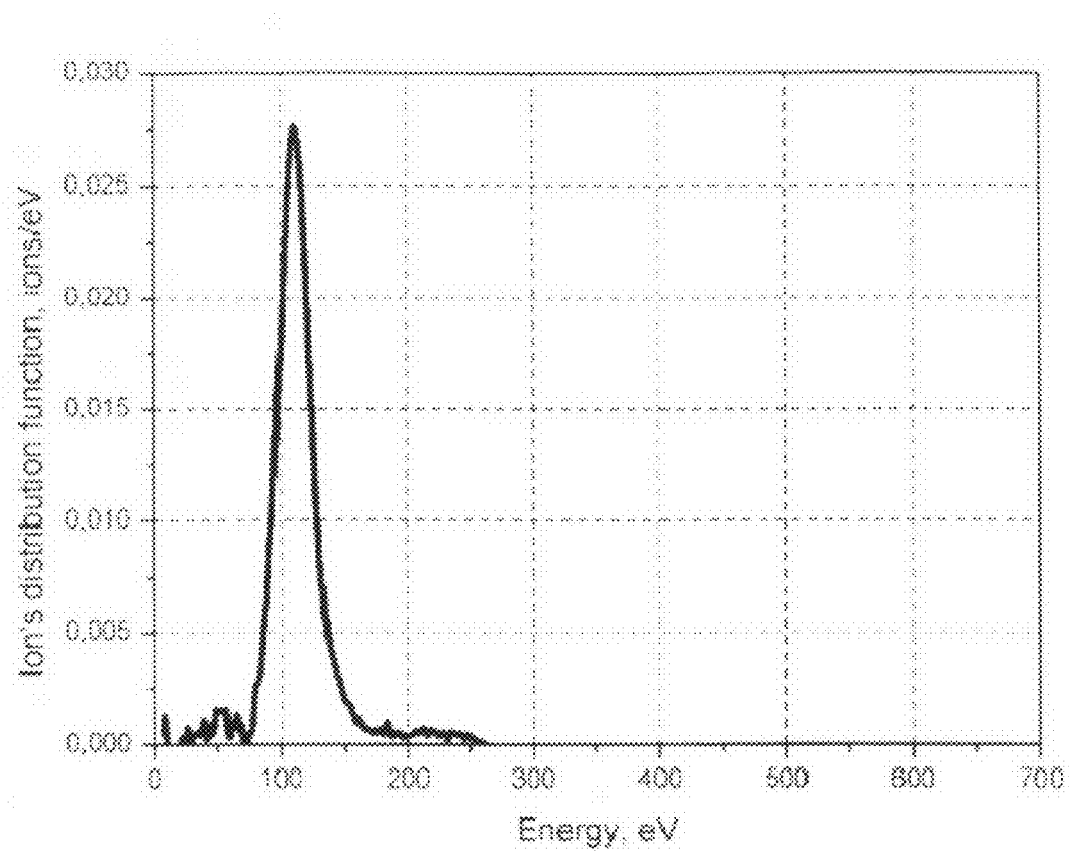
FIG. 6b is a graphical representation depicting an ion beam energy distribution for invented a two-chamber anode end-Hall ion source for Oxygen-Xenon mixture for the following operating conditions: anode voltage $V_d$=130 V, $I_d$=4 A; gas flow: $\square_a$=22.7 sccm $O_2$ and $\square_a$=3.6 sccm Xe; $E_i$≈114 eV, $E_i/eV_d$≈0.88.

In this part of a patent there is described and shown in FIG. 6a a schematic and three-dimensional drawing of an end-Hall ion source with a multi-chamber anode with its simplest approach in a form of a two-chamber with introduction of a working gas from an anode first chamber into a second chamber and from a second chamber through a series of holes in a lower part of anode into a discharge channel that mainly consists of a hollow cone-type electrode occupying most part of a discharge channel. An end-Hall ion source of a multi-chamber design, as it will be seen from measurements of ion beam energy distributions and ion beam currents, shows a substantial improvements in comparison with above described in a Prior Art various end-Hall designs, demonstrating a quite narrow ion beam energy distribution with similar to a gridded ion source, except that, in this case, the ion beam energies are in the range of low energies from about 20 eV and up to about 200 eV with ion beam currents significantly higher than of gridded ion sources. The ion beam energy distribution of end-Hall ion source with a multi-chamber anode is shown in FIG. 6b.

Another approach with a multi-chamber anode is a specific anode geometry design maintaining standard operation conditions with reactive gases that in regular prior art end-Hall ion sources leading to a "poisoned" anode deposited with dielectric and insulating thin films that hinder standard operation. This design has a narrow slit in a lower part of the anode and this anode has a surface that is not deposited with contaminating particles as it is shown in a FIG. 7a. The ion beam energy distribution of end-Hall ion source with a multi-chamber anode and with a narrow slit in a lower part of the anode is shown in FIG. 7b.

A retarded potential probe is widely utilized for an ion energy distribution. A one screen retarded potential probe was described in "Operation of Broad-Beam Sources", by H. R. Kaufman and R. S. Robinson, published by Commonwealth Scientific Corporation, Alexandria, Va., 1987. This retarded potential one grid probe was also recently described in "Low-Energy End-Hall Ion Source Characterization at Millitorr Pressures", by J. R. Kahn. H. R. Kaufman et al, Proceedings of 48th SVC Annual Technical Conference, 2005, p 445-451. One grid performs function of a partial decreasing of a plasma flow coming into a collector. Though a two-electrode (grid and collector) probe makes possible to obtain an ion energy distribution, it has certain shortcomings: a grid's high electric potential brings a strong disturbance to plasma, the photoelectron and secondary electron emissions are not sufficiently suppressed. For a suppression of photoelectron and secondary emissions there are utilized additional grids. Latest approach in retarding potential probes is utilization of a series of grids, such as two, three and even four grids for increasing accuracy and resolution.

An energy spectrum of ion beam coming out from the invented end-Hall ion source is provided by a measurement of a retarding potential characteristic of an electrostatic energy analyzer described in detail in a work "BaumVille, Ion Probe Set" version 2, Model 3m51.LPT by P. Tsygankov, and commercially available since 2003. This energy analyzer can be used also as a Faraday ion beam current probe for measurements of an ion beam current density.

In a work "End-Hall Ion Source Characterization at High Power", D. Burtner, V. Zhurin, D. Siegfried, 48th Annual SVC Technical Conference, Denver, Colo., April 2005 there was utilized a two-grid probe also made by a "BaumVille, Ion Probe Set" by P. A. Tsygankov earlier design. In a "Characterization of a High Output Gridless Ion Source" by D. Gardner, W. Sainty and published in 48th Annual Technical Conference Proceedings, 2005 for an ion beam energy distribution there was utilized a modified Faraday probe with two grids similar to a above mentioned work "End-Hall Ion Source Characterization at High Power", D. Burtner, V. Zhurin, D. Siegfried, 48th Annual SVC Technical Conference, Denver, Colo., April 2005.

In this work there was utilized a five-electrode probe (four grids and collector is an additional electrode), in which there is introduced an additional grid that is called a suppressor grid. An additional negative relative to collector potential is applied to this grid; this potential develops a retarding potential for the secondary electrons. Gridded electrodes of the electrostatic energy analyzer provide plasma screening from a probe's disturbing potential, separation of a plasma beam's ion component and elimination of impact of a secondary electron emission of an entrance grid. A probe's entering surface diameter is 21 mm. For increasing a probe's space resolution there are utilized various diaphragms with calibrated entering holes. The energy analyzing probe effectively registers ion beams with pressures of working gases from low of $5 \cdot 10^{-5}$ to high $5 \cdot 10^{-3}$ Torr. For registration of the retarding potential characteristics $I_{col}(E_i)$, which is the dependence of an ion current on the collector as function of the collector's potential $V_{col}$, changing its potential in the range of 0 to 3000 V with the step of less than 3 V, the analyzing voltage is registered by a high-sensitive (0.3-15 mA) differential amplifier with the automatic selection of amplification.

In FIG. 6a there is shown a schematic and three-dimensional drawing of invented end-Hall ion source 600 with a two-chamber anode and a working gas introduction through a lower part of anode of a series of holes. On FIG. 6a the following parts are designated: a two-chamber anode is 601; an insulator 602 between a reflector 610 and anode 601; an upper flange—pole 603; a working gas flow application 604 into a two-chamber anode 601; a first chamber 605 of a two-chamber anode 601; a second chamber 606 of a two-chamber anode 601; a permanent magnet 608; a series of holes 609 for gas introduction from a first chamber 605 into a second chamber 606; a series of holes 607 for introduction of a working gas from a second chamber 606 into a discharge channel 611. A cathode, which is usually a Hot Filament, or a Hollow Cathode, or other source of electrons, is not shown in this and other FIGs for simplicity. This design provides an improved working gas distribution than the regular designs shown in FIGS. 1, 2a, 3a. Working gas introduction in the anode area through a series of holes 607 in a lower part of anode provides improved ionization process in area of a lower part of anode applying electric potential only in a narrow region leading to high ratio transformation of a discharge voltage into a mean ion beam energy. Since ionization and acceleration applied to anode potential takes place at a narrow cross section, practically all particles have the same energy providing a quite narrow ion beam energy distribution.

In FIG. 6b there is shown a graphical representation of an ion beam energy distribution made with an invented end-Hall ion source of a two-chamber anode. The operating parameters of end-Hall ion source were: a working gas is a mixture of two gases Oxygen-Xenon with Oxygen mass flow $\square_a$=22.7 sccm, and Xenon mass flow $\square_a$=3.6 sccm; a discharge voltage is $V_d$=130 V, and a discharge current is $I_d$=4 A. As one can see, a mean ion energy $E_i \approx$114 eV. In the regular Prior Art end-Hall ion sources shown in FIGS. 1, 2 and 3 the ratio $E_i/eV_d \approx$0.6-0.7. In the invented end-Hall design with the two-chamber working gas introduction this ratio is $E_i/eV_d \approx$0.9. Both FIG. 6b, which is a graphical representation of an ion beam energy distribution made with an invented end-Hall ion source of a two-chamber anode and FIG. 4b, which is a graphical representation of an ion beam energy distribution made with a gridded ion source, are made at the same scale, and one can see that both pictures are very much similar in a total energy distribution spread around a mean ion beam energy, except that in FIG. 4b there is shown an ion beam energy distribution for a gridded ion source with a discharge accelerating voltage of $V_d$=600 V and in FIG. 6b there is shown an ion beam energy distribution for the invented ion source at $V_d$=140 V. An invented end-Hall ion source has quite narrow ion beam distribution around a mean ion energy. In this particular case, shown in FIG. 6b an ion beam energy $E_i \approx$114±30 eV and there are practically no low energy ions of substantial volume. A narrow energy distribution without spread into low and high energies testifies that area of electric potential is applied mainly into anode narrow region, where a working gas is introduced, and has no large electric potential oscillations that usually lead to spread of ion beam energies bigger than an applied electric potential value.

Figure 7A:
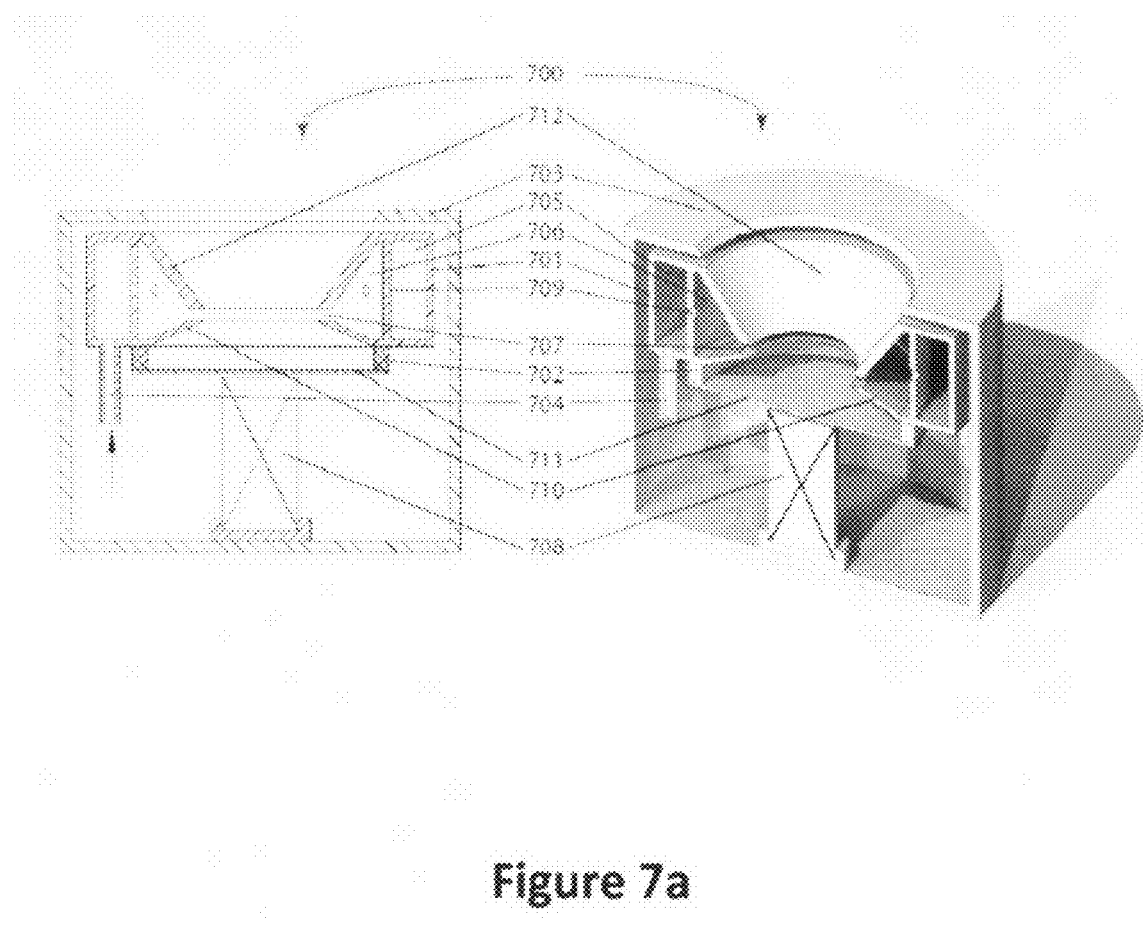
FIG. 7a is a schematic and three-dimensional drawing of the invented end-Hall ion source with a two-chamber anode with applied working gas through a first chamber in an anode and then into a second chamber in anode with a cavity in anode for working gas introduction into a discharge chamber and providing large area of an electrically conducting surface in an anode cavity to reduce effects of dielectric and insulating layers depositions on anode operation with reactive gases.
Figure 7B:
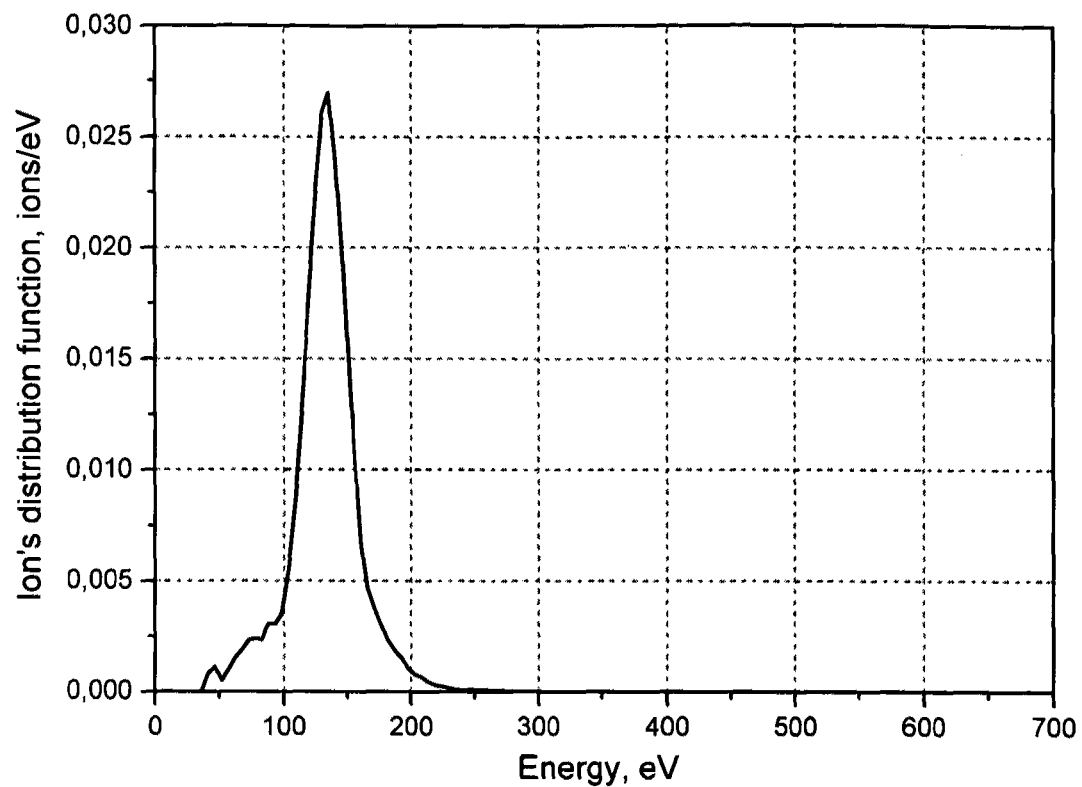
FIG. 7b is a graphical representation depicting an ion beam energy distribution of the invented end-Hall ion source with a two-chamber anode with a cavity to reduce an impact of dielectric and insulating layers depositions on anode operation for Oxygen-Xenon mixture and the following operating conditions: anode voltage $V_d$=130 V, $I_d$=4 A; gas flow: $\square_a$=22.7 sccm $O_2$ and $\square_a$=3.6 sccm Xe; $E_i$≈114 eV, $E_i/eV_d$≈0.88.

In FIG. 7a there is shown a schematic and three-dimensional drawing of an invented end-Hall ion source 700 with a two-chamber anode 701 with a slit gas exit 707 and extended surface area under a tapered anode lower part 710 and is not "seen" for particles returning back to anode area from a target (not shown) or a vacuum chamber (not shown). Other parts are: 712 is anode external surface; 702 is insulator between anode 701 and reflector 711; 703 is upper flange—pole; 704 is a working gas introduction into a first chamber 705 of a two-chamber anode 701; 706 is a second chamber. During operation with reactive gases, when the anode surface 712 becomes covered with dielectric and/or insulating thin films and can cause an anode "poisoning" above discussed; the anode cavity's surface area 710 under a tapered anode lower part is not covered with dielectric and/or insulating thin films, remaining electrically conducting and continuing electric discharge in such conditions.

In FIG. 7b there is shown a graphical representation of an ion beam energy distribution made with a two-chamber anode with a slit gas exit and extended area under a tapered anode lower part. As one can see, these ion beam energy distributions are practically the same as with a two-chamber anode and with a working gas exit through small holes in a low part of anode.

In Table 1 there are presented data for the ion beam energy distribution measurements for various working gases such as Krypton, Argon, Oxygen and Nitrogen. These data show that noble gases Krypton and Argon can operate at low discharge voltages of about 25 V for Krypton and about 50 V for Argon. The ion beam energy distribution spread is low, from about 15 eV and up to about 25 eV at low discharge voltages. For higher energies, the energy distribution spread is up to 50 eV. For reactive gases Oxygen and Nitrogen, the discharge voltages start from about 80 V and up. Reactive gases have quite low energy spread, and for one of the most frequently utilized discharge voltage in practice of thin film depositions of $V_d$=100 V its ion beam mean energy is $E_i \approx$80±20-25 eV. With increase of discharge voltage and current the energy distributions have tendency for expansion. It is important to emphasize that in the Prior Art end-Hall ion sources the ratio $E_i/eV_d \approx$0.6-0.7. In the invented multi-chamber anode end-Hall this ratio with exception of low energies $E_i/eV_d \approx$0.8-0.9. This number indicates a better energy efficiency translation in the invented multi-chamber anode end-Hall ion source.

Operational characteristics of an invented end-Hall ion source for various gases and mixtures:

TABLE 1

| Gas | $I_d$, A | $V_d$, V | $E_i$, eV | ± eV | $E_i/eV_d$ |
|---|---|---|---|---|---|
| Kr | 1.0 | 25 | 17 | 18 | 0.68 |
|  | 5.0 | 23 | 19 | 13 | 0.83 |
|  | 5.0 | 100 | 98 | 50 | 0.98 |
|  | 1.0 | 140 | 130 | 50 | 0.93 |
| Ar | 1.0 | 47 | 37 | 14 | 0.79 |
|  | 5.0 | 49 | 42 | 15 | 0.86 |
|  | 3.0 | 100 | 94 | 25 | 0.94 |
|  | 1.0 | 140 | 130 | 40 | 0.93 |
| O₂ | 1.0 | 77 | 60 | 15 | 0.78 |
|  | 3.0 | 86 | 70 | 15 | 0.81 |
|  | 3.0 | 100 | 85.5 | 25 | 0.8 |
|  | 3.0 | 140 | 129 | 30 | 0.92 |
|  | 3.0 | 180 | 174 | 35 | 0.97 |
| N₂ | 1.0 | 85 | 30 | 30 | 0.35 |
|  | 5.0 | 100 | 85.5 | 25 | 0.85 |
|  | 3.0 | 140 | 132 | 25 | 0.94 |
|  | 5.0 | 140 | 128 | 27.5 | 0.91 |
| Mixtures: |  |  |  |  |  |
| Kr(58%) + O₂(42%) | 3.0 | 100 | 90 | 25 | 0.90 |
| Kr(80%) + O₂(20%) | 3.0 | 100 | 94 | 15 | 0.94 |
| Ar(48%) + O₂(52%) | 3.0 | 100 | 81 | 25 | 0.84 |
| Ar(73%) + O₂(27%) | 3.0 | 100 | 84 | 17 | 0.84 |
| Xe(3%) + O₂(97%) | 4.0 | 130 | 90 | 30 | 0.69 |
| Xe(8%) + O₂(92%) | 4.0 | 130 | 108 | 25 | 0.83 |
| Xe(14%) + O₂(86%) | 4.0 | 130 | 114 | 20 | 0.88 |
| Xe(21%) + O₂(79%) | 4.0 | 130 | 118 | 18 | 0.91 |

Analysis of TABLE 1 shows that an ion beam energy distribution depends on ionization potential of a working gas, a discharge voltage $V_d$, and current $I_d$. In general, the higher the discharge voltage and current and ionization potential, the wider an ion beam energy distribution. With the working gases mixtures, the higher the ratio of a noble gas mass flow to a reactive gas, the higher the ratio of a mean ion beam energy to a discharge potential times electron charge, the lower a mean ion beam energy spread.

Figure 8:
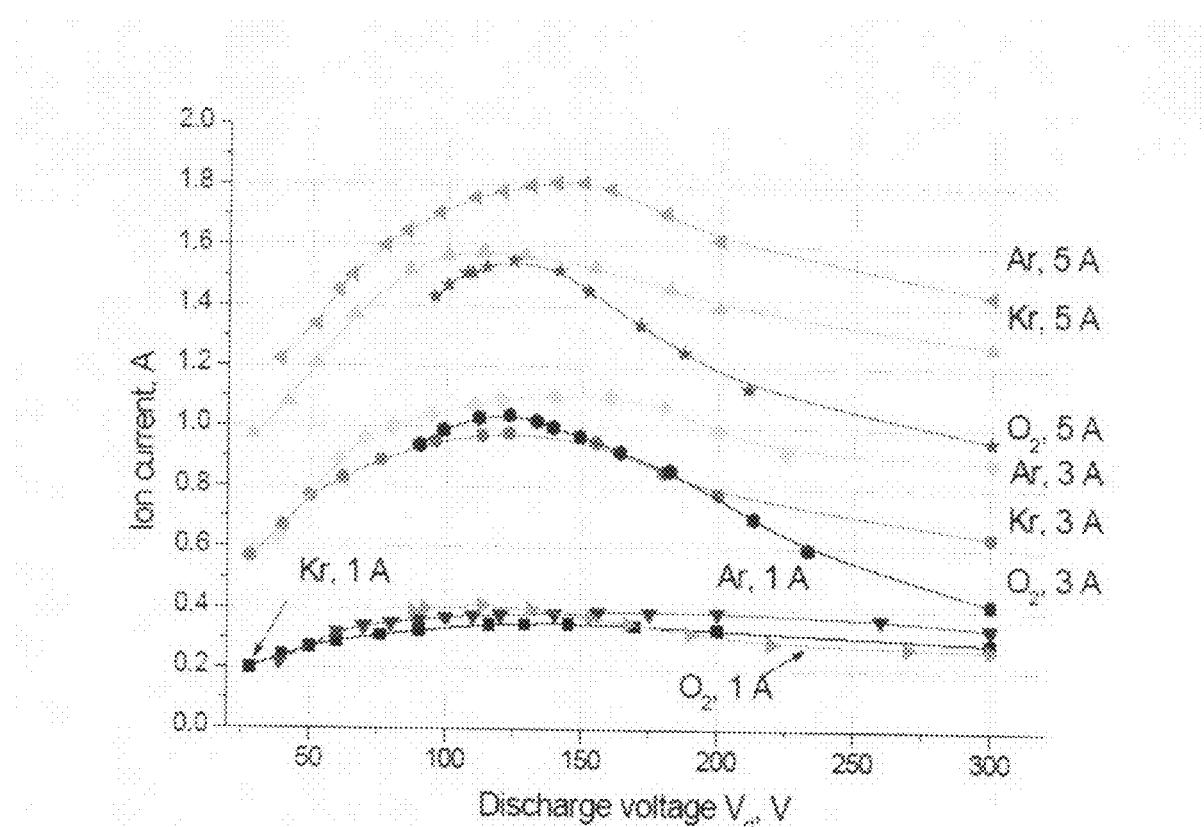
FIG. 8 is a graphical representation depicting an ion beam current $I_i$ for discharge currents $I_d$=1, 3, 5 A as function of discharge voltage from about $V_d$≈25 V and up to $V_d$=300 V, for different working gases, such as Argon, Krypton, Oxygen of the invented end-Hall ion source with a two-chamber anode.

In FIG. 8 for the invented end-Hall ion source there is presented a graphical representation of the ion beam currents $I_i$ as function of the discharge voltages $V_d$ for several discharge currents $I_d$ and various working gases: Argon, Krypton and Oxygen. As one can see, the range of operating discharge voltages is quite broad, especially, for noble gases: from about $V_d \approx 25$ V for Kr, $V_d \approx 40$ V for Ar, and $V_d \approx 80$ V for $O_2$, and up to $V_d = 300$ V for all gases. Also, it is easy to see that the ion beam currents for all gases for $I_d = 1$ A are about 0.4 A for all gases. With the discharge current increase, the ratio $I_i/I_d \geq 0.3$, which is still higher than for all mentioned in the Prior Art end-Hall ion sources. The experiments with mixtures of noble and reactive gases showed that all additional flows of noble gases make possible to reduce a lowest discharge voltage of mixtures with reactive gases substantially: the higher the ratio of a noble gas to a reactive gas, the lowest initial discharge voltage of a mixture. For example, practically all noble gases with Oxygen allow an ion source operation at discharge voltage of about 50 V, which corresponds to about 40 eV of a mixture ion beam energy. Even with a low Oxygen ratio to a noble gas of about 30% still provides excellent oxidizing properties, especially with Xenon.

Figure 9A:
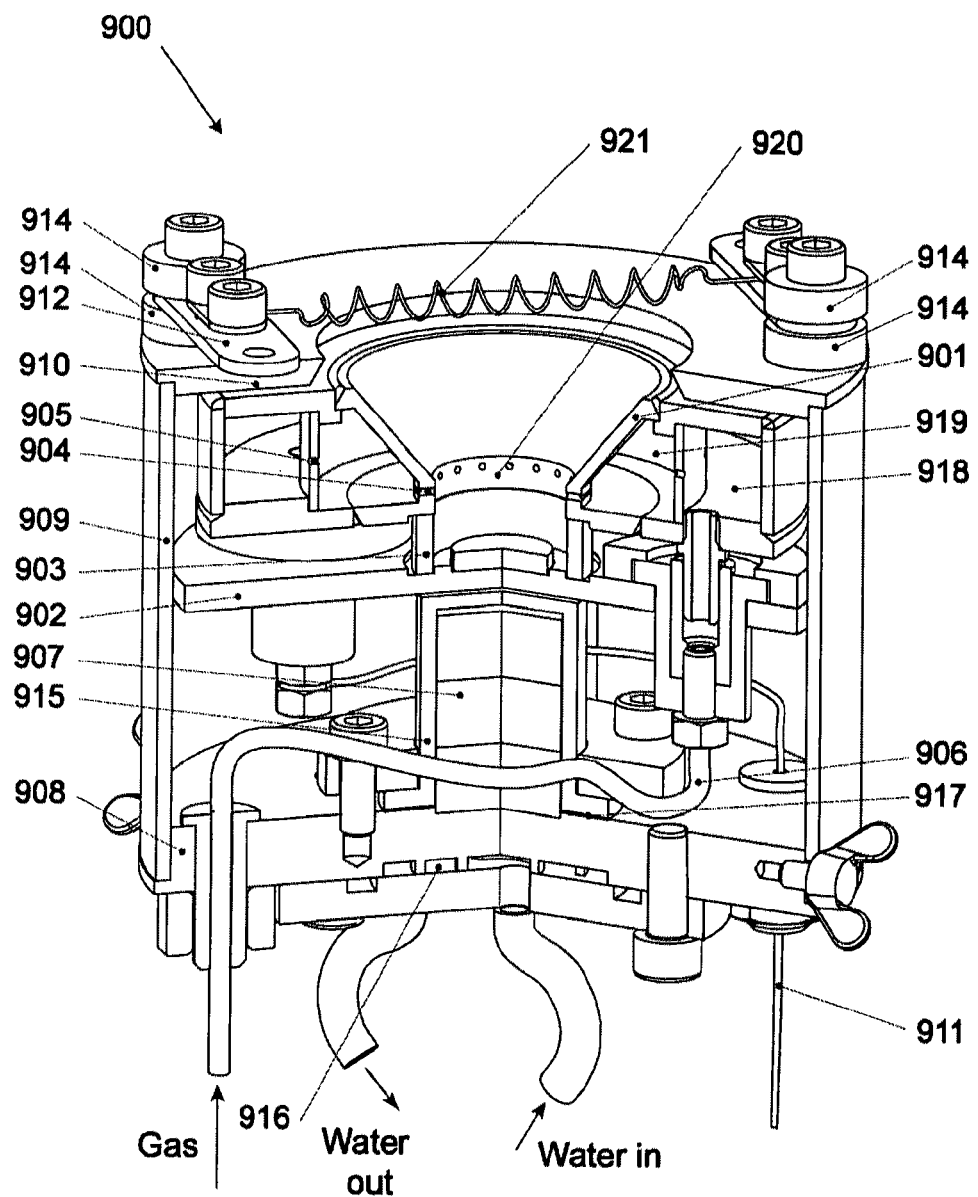
FIG. 9a is a schematic drawing of the invented end-Hall ion source with a two-chamber anode and specific most important parts.

In FIG. 9a there is presented one of specific designs of the invented end-Hall ion source with the parts as follows: an ion source design picture 900; a two-chamber anode 901; a plate separating a section with magnets that usually called as a reflector 902; gas distributing holes 905 from an anode first chamber 918 into a second anode chamber 919, from which holes 904 a working gas is applied into a discharge channel 920; a gas feed tube 906 introducing a working gas into a first anode chamber 918; a stack of permanent magnets 907 serving as an internal pole and placed under a reflector plate 902; a base plate 908 with water cooling line shown by "water in" and "water out" for cooling an ion source shell and for stabilization of magnets 907 temperature; an ion source's outer shell 909; an external flange 910 serving as a magnetic pole; a power supply connection 911 to anode 901; a hot filament 921; a hot filament support 912; insulators 913 for a hot filament support 912; a copper shield 916 for stabilization of magnets 907 temperature; an Indium foil layers 915 for enhancement of thermal conductivity from a water cooled area to magnets. This end-Hall design was operating with various working gases from low discharge voltages of about 20 V and up to 300 V with discharge currents from under 1 A and over 5 A, as it is shown in FIG. 8. The larger dimension version operates with the same discharge voltages from about 20 V and up to about 300 V and with discharge currents up to 11 A, limited only by a Power Supply.

In FIG. 9a there is presented a regular placement of a Hot Filament 921 across of an ion source exit. Such Hot Filament placement, as it was discussed above, is regularly utilized with majority of industrial end-Hall type ion sources, because it is simple and cheap. Some users have Hollow Cathodes, Plasma Bridge and other neutralizing means. After breaking a Hot Filament, which, in most cases, takes place in a middle of a Hot Filament due to an ion bombardment, is substituted for a new filament. However, during an ion source operation a filament becomes sputtered by an ion beam and contaminates it.

Figure 9B:
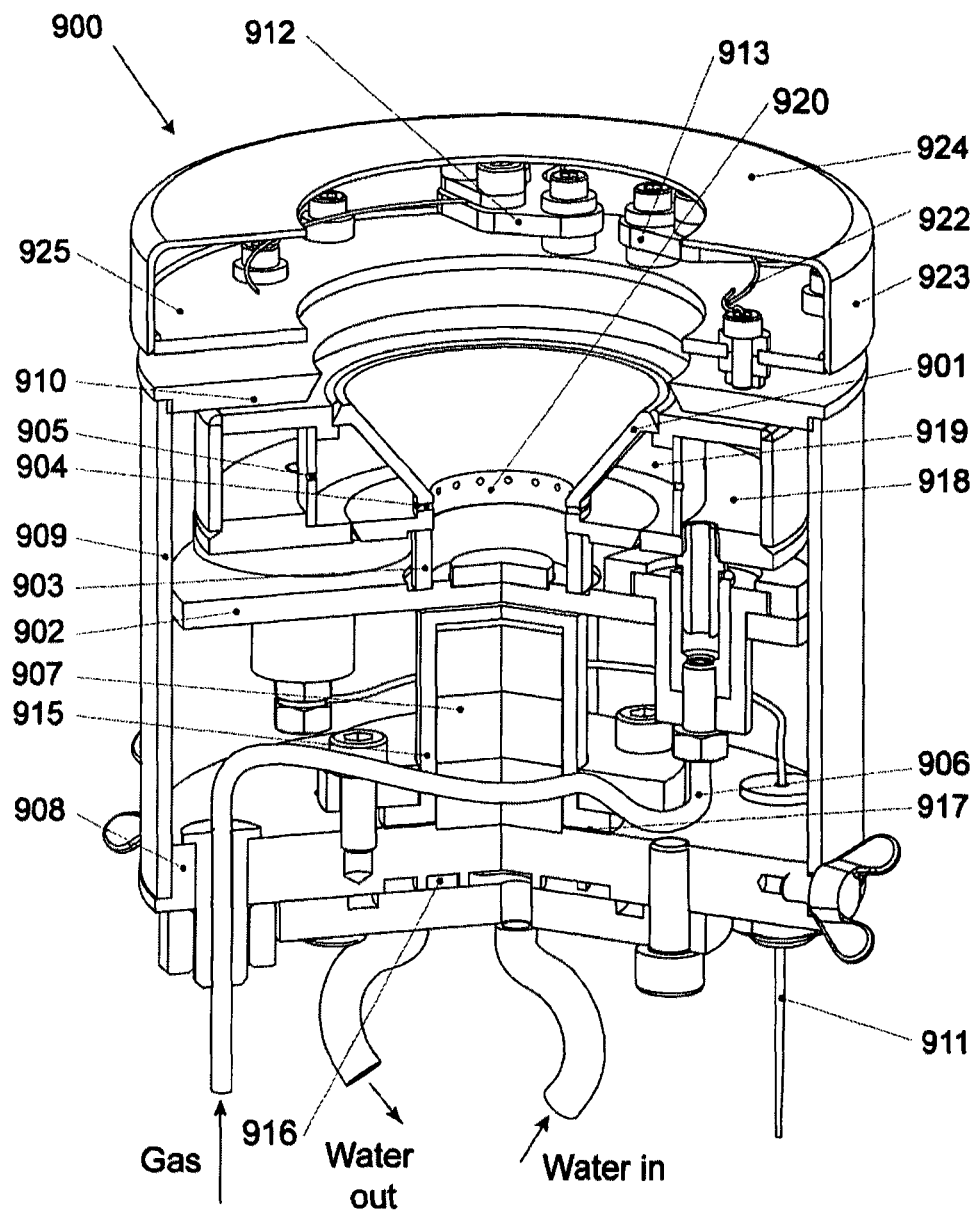
FIG. 9b is a schematic drawing of the invented end-Hall ion source with placement of a Hot Filament around an exit flange and its most area is covered by a metal shield that prevents radiation from a Hot Filament and its sputtered particles.

In FIG. 9b there is presented a new version of the invented end-Hall ion source with placement of a Hot Filament around an exit flange and its most area is covered by a metal shield that prevents radiation from a Hot Filament and its sputtered particles. The main parts of this new design with a Hot Filament are: a Hot Filament wire 922 that is extended over all perimeter of a metal shield exit flange 925; a Hot Filament is protected by a metal shield from its side 923 and from a top 924; a Hot Filament supports 912 and 913, which have connections with a Hot Filament's Power Supply, in this version are placed close to each other to have more uniform emission from a Hot Filament practically over all exit area; insulators 914 help to separate Hot Filament supports from a flange 910. For one particular experimental end-Hall ion source a Hot Filament wire 922 was at about 5 mm from an exit flange edge and vertically at a top protective shield 924 this filament was also inside by about 5 mm, and it is not seen looking on ion source's axis. All metal shield 925, 923 and 924 around a Hot Filament 922, in some cases, is at a ground potential, and, in some other cases, is at a negative potential to enhance movement of electrons from a shielded area into an ion source discharge channel for a working gas ionization and ion beam neutralization, and in an ion source exit area for neutralization of an ion beam.

The shielded Hot Filament 922, shown in FIG. 9b, produced all necessary operational characteristics for a neutralizing ion beam Hot Filament; it was tested with practically all reactive and noble gases and it was possible to provide neutralization of an ion beam up to discharge currents of 11 A with a neutralization emission current of 11.5 A; and its discharge current was limited only by an available Power Supply. Its operational characteristics were even higher than the traditional one with a Hot Filament placed across an exit flange shown in FIG. 9a. These are main different features of a shielded Hot Filament, and comparisons with a traditional Hot Filament placed across an ion source's exit flange. 1) At the same operation conditions with the discharge current Id and voltage Vd it consumes less working gas than with a regular Hot Filament placement across an ion source's exit flange. 2) The ion source with a shielded Hot Filament has wider operational energy range; it starts at lower Vd and goes at higher Vd than an ion source with a regular Hot Filament placement across an ion source's exit flange. One of the main reasons that end-Hall ion sources do not operate over 300 V is an early break of a Hot Filament under a high energy ion beam. In the conditions of a shielded cathode an ion source operates over 300 V and up to 500 V, because a Hot Filament is not bombarded by ion beam anymore. 3) The ion source with a shielded Hot Filament has narrower ion beam spread, because in a regular Hot Filament placement across an ion source's exit flange its heated spiral radiates practically in every sides and ion beam follows after the electrons coming out of a heated wire. 4) The ion source with a shielded Hot Filament produces less heating of the substrate than a traditional one, because all radiation from a shielded Hot Filament is covered by the shield. 5) The ion source with a shielded Hot Filament has a cleaner ion beam because its beam is not contaminated by the Tungsten or Tantalum particles as it takes place in a regular Hot Filament placed across an ion source's exit flange. 6) In case of utilization of two Hot Filaments for extension of ion source operation during long hours, as some companies practice, the broken burned Hot Filament would not contaminate an ion beam flow, as it takes place in the regular approach with two Hot Filaments placed across an ion source's exit flange. 7) The ion source with this shielded Hot Filament can use a Tantalum wire, which in usual traditional placement sags and makes ion source performance is not reliable. In the design presented in this patent application a Tantalum wire does not sag because it is supported in five points. Tantalum wire operates at lower temperatures than Tungsten and has a higher electron emission.

Figure 9C:
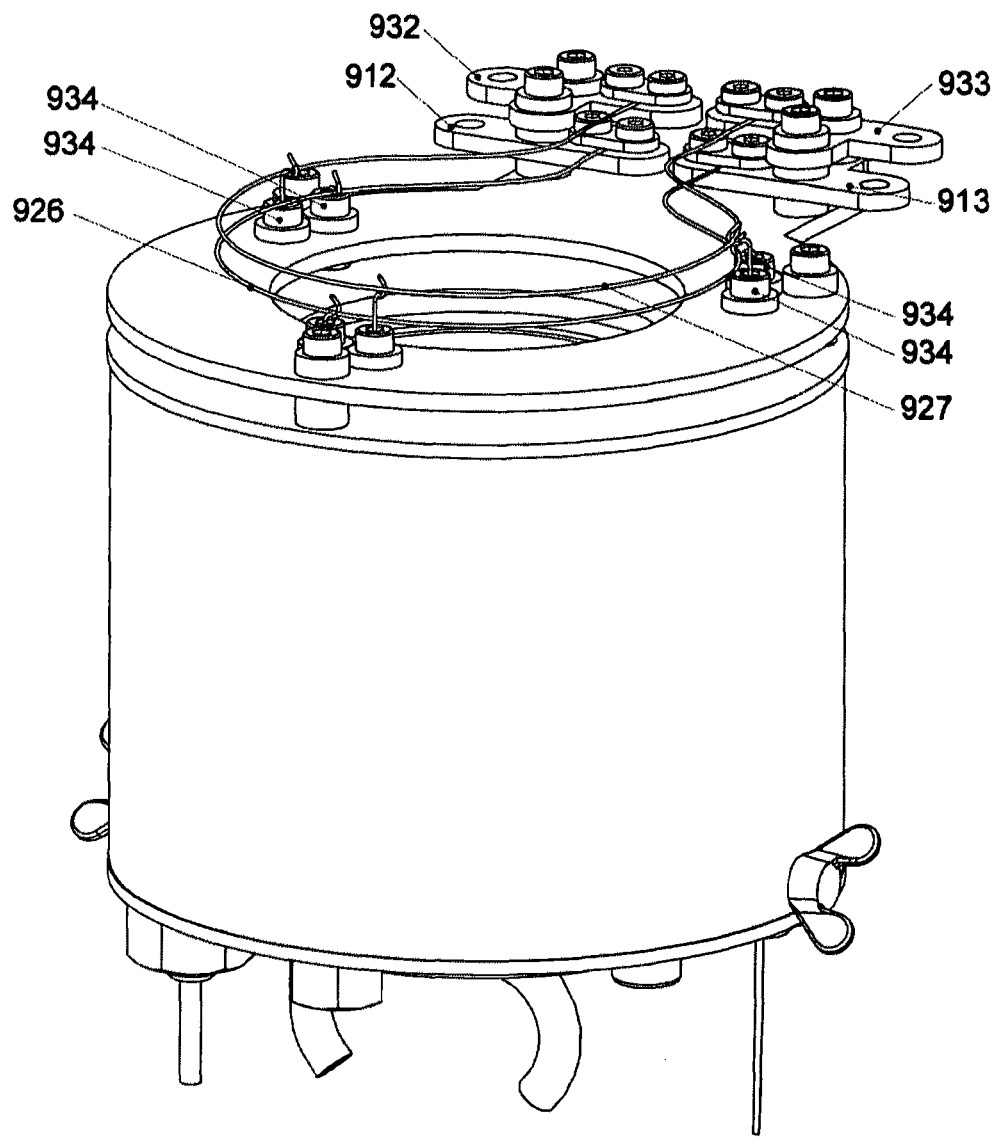
FIG. 9c is a schematic drawing of a fragment of an ion source with the shielded two Hot Filaments.

In FIG. 9c there is shown a fragment of an ion source with the shielded two Hot Filaments 926 and 927. The Hot Filaments supports 912-913 and 932-933 with electrodes for connection to a power Supply are seen in FIG. 9c. For simplicity a shield over Hot Filaments is not shown. The idea behind this double Hot Filament design is simple: even that a shielded Hot Filament has longer lifetime than a traditional Hot Filament placed across an ion source's exit flange, the two shielded Hot Filaments provide tens of operating hours with all working gases and at even very high discharge voltages over 150 V and currents over 5 A.

Figure 9D:
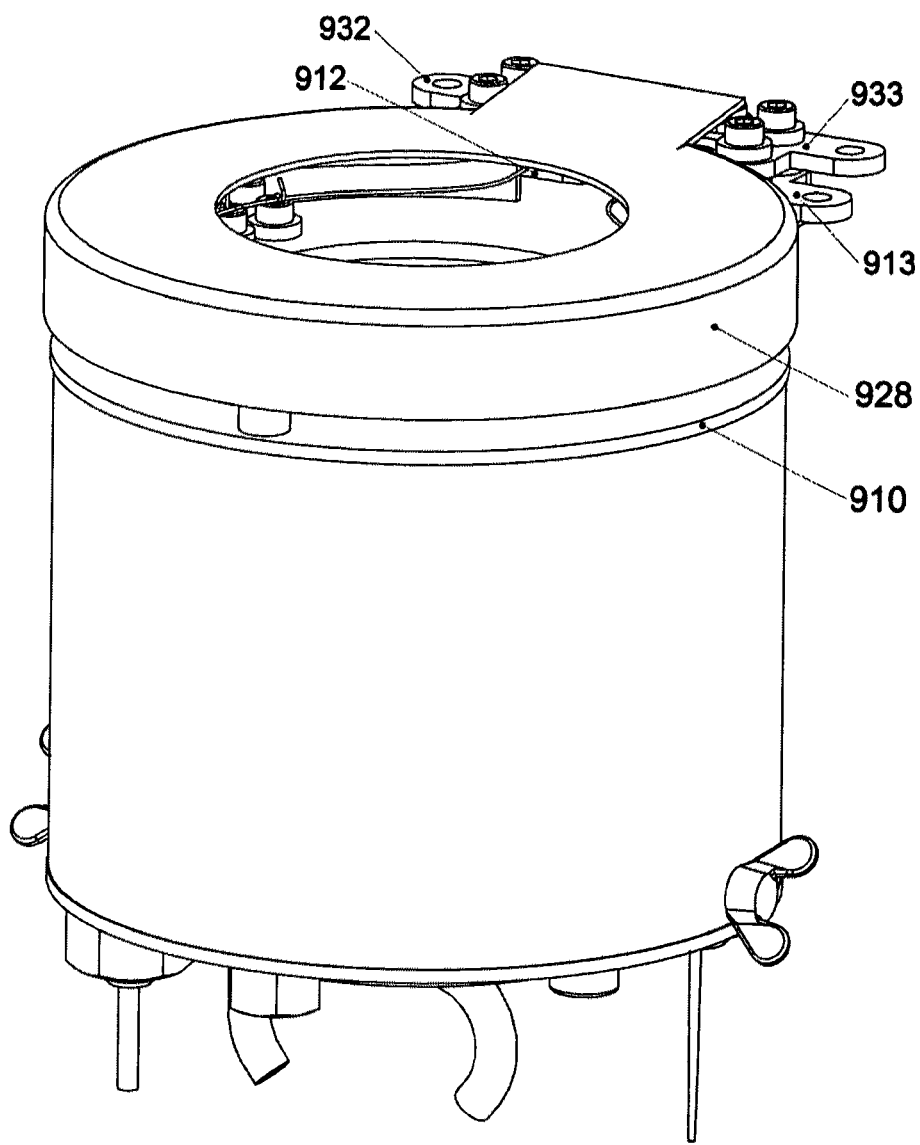
FIG. 9d there is a schematic drawing of a fragment of an ion source with two Hot Filaments covered by a shield.

In FIG. 9d there is shown a fragment of an ion source with two Hot Filaments covered by a shield 928. The Hot Filaments supports 912-913 and 932-933 with electrodes for connection to a power Supply are seen in FIG. 9d too. At this FIG. 9d there is also shown an ion source's exit flange 910. A placement of Hot Filaments supports is partially seen in this FIG. 9d. All design is simple and easy to operate. After stopping an ion source's work and opening a vacuum chamber a cover shield-cup is removed and one can have easy access to the Hot Filaments, and if necessary, to substitute one or two filaments.

In conclusion, in this invented ion source with a multi-chamber anode and introduction of a working gas in a lower part of anode, close to a reflector, there are several important features that distinct this ion source from the Prior Art ion sources:

1. It has quite narrow ion beam energy distribution; this feature can be used in varieties of thin film depositions, especially in Ion Assist Depositions that can help control thermal stress during thin film deposition;

2. This design provides high mean ion beam energies from a discharge voltage of about $E_1=(0.8-0.9) \cdot V_d$ in comparison with the Prior Art end-Hall ion sources of $E_i=(0.6-0.7) \cdot V_d$;

3. This design provides higher ion beam currents of $I_i=(0.3-0.4) \cdot I_d$ in comparison with the Prior Art end-Hall ion sources of $I_i=(0.2-0.25) \cdot I_d$;

4. This design provides low erosion (sputtering) rate of a reflector of about $\xi=(3-5) \cdot 10^{-6}$ g/s in comparison with the Prior Art end-Hall ion sources of $\xi=(1-3) \cdot 10^4$ g/s, and this feature testifies about purity of an ion beam coming from the invented ion source.

5. This design with a multi-chamber anode and a slit introduction of a working gas in a lower part of anode and an anode surface area that is protected from reflected particles returning back to a discharge channel and depositing on an anode opened surface for returned particles allows operation of the invented end-Hall ion source for a long time without anode being "poisoned" while operating with reactive gases like Oxygen, Nitrogen, Hydrogen, etc.

6. This design with a multi-chamber anode showed stable operation not only with reactive and noble gases, but with mixtures of reactive gases with noble gases, making possible obtaining ion beams at low energies of reactive gases below 50 eV with low ratio below 0.2 of reactive gas to a noble gas, especially such gases as Xenon and Krypton.

7. This ion source design with a multi-chamber anode and with a shielded Hot Filament demonstrated very reliable neutralizing characteristics with the ion source discharge current up to 11.0 A with the emission current of 11.5 A and the discharge voltage of 200 V. It is necessary to note that most known end-Hall ion sources operate under 11.0 A of a discharge current; regular industrial end-Hall ion sources utilize discharge currents in the range of $I_d$=1-5 A.

While particular embodiments of the present invention have been shown and described, it will be evident to those skilled in the art that changes and modifications may be made without departing from the invention in its broadest aspects. Therefore, the aim in the appended claims is to cover all changes and modifications that are in the spirit and scope of what is patentable.

We claim:

1. A Hall-current ion source with electric potential impressed between a cathode and an anode in a discharge channel, where electrons move in an axial and radial magnetic field in said discharge channel developed by a working gas distributing system, a permanent magnet and an external flange serving as magnetic poles, where electrons move in partially closed drift electron trajectories; wherein electrons produced by an externally placed cathode collide with neutral particles and generate ions that are not influenced by said magnetic field and move axially to exit said ion source producing plasma flow comprising ions and electrons; the ion source comprising:

a positively charged hollow cut cone anode positioned in said discharge channel; wherein said anode comprises multiple chambers for uniform working gas distribution; wherein said anode further comprises a lower part having a plurality of small holes which communicate between said discharge channel and one of said multiple chambers; wherein said anode includes an upper part, and wherein the distance between said upper part and said external flange is less than about 20 mm;

a cathode located outside of said discharge channel for producing electrons for working gas ionization and neutralization of generated ions in said discharge channel;

a working gas distributing system imbedded in said anode with an enhanced working gas distribution through said plurality of holes in said anode;

a permanent magnet positioned below said anode;

a reflector comprising an electrically conducting plate positioned on top of said permanent magnet and below said anode's lower part; said reflector being at a floating electrical potential;

wherein introduction of said working gas through said holes in said anode confines the area of developed ions and electric potential application to said developed ions to produce a narrow ion beam energy distribution where $E_i$ is about (0.8-0.95) $eV_d \pm 20$-25 eV.

2. A Hall-current ion source with electric potential impressed between a cathode and an anode in a discharge channel, where electrons move in an axial and radial magnetic field in said discharge channel developed by a working gas distributing system, a permanent magnet and an external flange serving as magnetic poles, where electrons move in partially closed drift electron trajectories; wherein electrons produced by an externally placed cathode collide with neutral particles and generate ions that are not influenced by said magnetic field and move axially to exit said ion source producing plasma flow comprising ions and electrons; the ion source comprising:

a positively charged hollow cut cone positioned in said discharge channel; wherein said anode comprises multiple chambers for uniform working gas distribution; wherein said anode further comprises a lower part and an upper part; wherein said lower part is tapered inwardly and defines a slit gas exit communicating between said discharge channel and one of said multiple chambers; wherein said tapered lower part further defines an extended surface area thereunder; wherein the distance between said upper part and said external flange is less than about 20 mm;

a cathode located outside of said discharge channel for producing electrons for working gas ionization and neutralization of generated ions in said discharge channel;

a working gas distributing system imbedded in said anode with an enhanced working gas distribution through said slit gas exit;

a permanent magnet positioned below said anode;

a reflector comprising an electrically conducting plate positioned on top of said permanent magnet and below said anode's lower part; said reflector being at a floating electrical potential;

wherein introduction of said working gas through said slit gas exit in said anode confines the area of developed ions and electric potential application to said developed ions to produce a narrow ion beam energy distribution where $E_i$ is about $(0.8-95)eV_d \pm 20\text{-}25$ eV; and wherein the ratio of ion beam current to discharge current is about 0.3-0.4.

3. The Hall-current ion source in accordance with claim 1 or 2 wherein said cathode comprises a shielded hot filament cathode.

4. The Hall-current ion source in accordance with claim 1, 2 or 3 wherein said anode comprises two chambers for uniform working gas distribution.

\* \* \* \* \*